(12) United States Patent
Leung et al.

(10) Patent No.: US 7,821,428 B2
(45) Date of Patent: Oct. 26, 2010

(54) MCU WITH INTEGRATED VOLTAGE ISOLATOR AND INTEGRATED GALVANICALLY ISOLATED ASYNCHRONOUS SERIAL DATA LINK

(75) Inventors: Ka Y. Leung, Austin, TX (US); Donald E. Alfano, Round Rock, TX (US); David P. Bresemann, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 258 days.

(21) Appl. No.: 12/165,011

(22) Filed: Jun. 30, 2008

(65) Prior Publication Data
US 2008/0317106 A1      Dec. 25, 2008

Related U.S. Application Data

(63) Continuation-in-part of application No. 12/060,049, filed on Mar. 31, 2008, which is a continuation-in-part of application No. 11/772,178, filed on Jun. 30, 2007, which is a continuation-in-part of application No. 11/089,348, filed on Mar. 24, 2005, now Pat. No. 7,302,247, which is a continuation-in-part of application No. 10/860,399, filed on Jun. 3, 2004, now Pat. No. 7,421,028, and a continuation-in-part of application No. 10/860,519, filed on Jun. 3, 2004, now Pat. No. 7,447,492, and a continuation-in-part of application No. 11/020,977, filed on Dec. 22, 2004, now Pat. No. 7,376,212, and a continuation-in-part of application No. 11/064,413, filed on Feb. 23, 2005, now Pat. No. 7,460,604.

(51) Int. Cl.
*H03M 9/00* (2006.01)

(52) U.S. Cl. ........................................ 341/101; 341/100

(58) Field of Classification Search ................ 341/100, 341/101, 141; 370/466
See application file for complete search history.

(56) References Cited

U.S. PATENT DOCUMENTS 3,058,078 A     10/1962    Hoh
(Continued)

FOREIGN PATENT DOCUMENTS

DE             10100282 A1     7/2002
(Continued)

OTHER PUBLICATIONS

"Publications—Geoff Walker", http://www.itee.uq.edu.au/~walkerg/publications/pubs_grw_links.html, May 2007.
(Continued)

*Primary Examiner*—Peguy JeanPierre
(74) *Attorney, Agent, or Firm*—Howison & Arnott, L.L.P.

(57) ABSTRACT

An integrated circuit comprises a first microcontroller unit for executing instructions in accordance with a first clock frequency. The microcontroller located on a first die and includes a first processing core for providing a parallel stream of data in accordance with the first clock frequency. A second microcontroller unit executes instructions in accordance with the first clock frequency. The second microcontroller is located on a second die and includes a second processing core for receiving the parallel stream of data in accordance with the first clock frequency. Capacitive isolation circuitry connected with the first microcontroller unit and the second microcontroller unit provides a high voltage isolation link between the first and the second microcontroller units. The capacitive isolation circuitry distributing a first portion of a high voltage isolation signal across a first group of capacitors associated with the first microcontroller unit and distributes a second portion of the high voltage isolation signal across a second group of capacitors associated with the second microcontroller unit. The capacitive isolation circuitry further transmits data from the parallel data stream between the first microcontroller and the second microcontroller in a serial data stream in accordance with the second clock frequency.

23 Claims, 12 Drawing Sheets

U.S. PATENT DOCUMENTS

| | | |
|---|---|---|
| 3,537,022 A | 10/1970 | Regan |
| 3,713,148 A | 1/1973 | Cardullo et al. |
| 3,714,540 A | 1/1973 | Galloway |
| 3,760,198 A | 9/1973 | Mori et al. |
| 3,798,608 A | 3/1974 | Huebner |
| 3,859,624 A | 1/1975 | Kriofsky et al. |
| 4,024,452 A | 5/1977 | Seidel |
| 4,027,152 A | 5/1977 | Brown et al. |
| 4,118,603 A | 10/1978 | Humhyr |
| 4,227,045 A | 10/1980 | Chelcun et al. |
| 4,302,807 A | 11/1981 | Mentler |
| 4,425,647 A | 1/1984 | Collins et al. |
| 4,459,591 A | 7/1984 | Haubner et al. |
| 4,523,128 A | 6/1985 | Stamm et al. |
| 4,536,715 A | 8/1985 | Basarath et al. |
| 4,538,136 A | 8/1985 | Drabing |
| 4,547,961 A | 10/1985 | Bokil et al. |
| 4,650,981 A | 3/1987 | Foletta |
| 4,675,579 A | 6/1987 | Hardy et al. |
| 4,703,283 A | 10/1987 | Samuels |
| 4,763,075 A | 8/1988 | Weigert |
| 4,780,795 A | 10/1988 | Meinel |
| 4,785,345 A | 11/1988 | Rawls et al. |
| 4,791,326 A | 12/1988 | Vajdic et al. |
| 4,817,865 A | 4/1989 | Wray |
| 4,818,855 A | 4/1989 | Mongeon et al. |
| 4,825,450 A | 4/1989 | Herzog |
| 4,748,419 A | 5/1989 | Somerville |
| 4,835,486 A | 5/1989 | Somerville |
| 4,853,654 A | 8/1989 | Sakurai |
| 4,859,877 A | 8/1989 | Cooperman et al. |
| 4,868,647 A | 9/1989 | Uehara et al. |
| 4,885,582 A | 12/1989 | LaBarge et al. |
| 4,922,883 A | 5/1990 | Iwasaki |
| 4,924,210 A | 5/1990 | Matsui et al. |
| 4,931,867 A | 6/1990 | Kikuchi |
| 4,937,468 A | 6/1990 | Shekhawat et al. |
| 4,945,264 A | 7/1990 | Lee et al. |
| 4,959,631 A | 9/1990 | Hasegawa et al. |
| 5,041,780 A | 8/1991 | Rippel |
| 5,057,968 A | 10/1991 | Morrison |
| 5,095,357 A | 3/1992 | Andoh et al. |
| 5,102,040 A | 4/1992 | Harvey |
| 5,128,729 A | 7/1992 | Alonas et al. |
| 5,142,432 A | 8/1992 | Schneider |
| 5,164,621 A | 11/1992 | Miyamoto et al. |
| 5,168,863 A | 12/1992 | Kurtzer |
| 5,204,551 A | 4/1993 | Bjornholt |
| 5,270,882 A | 12/1993 | Jove et al. |
| 5,293,400 A | 3/1994 | Monod et al. |
| 5,369,666 A | 11/1994 | Folwell et al. |
| 5,384,808 A | 1/1995 | Van Brunt et al. |
| 5,396,394 A | 3/1995 | Gee |
| 5,404,545 A | 4/1995 | Melvin |
| 5,418,933 A | 5/1995 | Kimura et al. |
| 5,424,709 A | 6/1995 | Tal |
| 5,442,303 A | 8/1995 | Asada et al. |
| 5,444,740 A | 8/1995 | Mizukami et al. |
| 5,448,469 A | 9/1995 | Rilly et al. |
| 5,467,607 A | 11/1995 | Harvey |
| 5,469,098 A | 11/1995 | Johnson, Jr. |
| 5,484,012 A | 1/1996 | Hiratsuka |
| 5,533,054 A | 7/1996 | DeAndrea et al. |
| 5,539,598 A | 7/1996 | Denison et al. |
| 5,544,120 A | 8/1996 | Kuwagata et al. |
| 5,555,421 A | 9/1996 | Enzinna |
| 5,572,179 A | 11/1996 | Ito et al. |
| 5,588,021 A | 12/1996 | Hunt et al. |
| 5,591,996 A | 1/1997 | Haigh et al. |
| 5,596,466 A | 1/1997 | Ochi |
| 5,615,091 A | 3/1997 | Palatnik |
| 5,615,229 A | 3/1997 | Sharma et al. |
| 5,625,265 A | 4/1997 | Vlahu |
| 5,627,480 A | 5/1997 | Young et al. |
| 5,627,488 A | 5/1997 | Tanzawa et al. |
| 5,650,357 A | 7/1997 | Dobkin et al. |
| 5,654,984 A | 8/1997 | Hershbarger et al. |
| 5,663,672 A | 9/1997 | Nuechterlein |
| 5,701,037 A | 12/1997 | Weber et al. |
| 5,714,938 A | 2/1998 | Schwabl |
| 5,716,323 A | 2/1998 | Lee |
| 5,731,727 A | 3/1998 | Iwamoto et al. |
| 5,731,954 A | 3/1998 | Cheon |
| 5,774,791 A | 6/1998 | Strohallen et al. |
| 5,781,071 A | 7/1998 | Kusunoki |
| 5,781,077 A | 7/1998 | Leitch et al. |
| 5,786,763 A | 7/1998 | Canipe |
| 5,786,979 A | 7/1998 | Douglas |
| 5,789,960 A | 8/1998 | Bower |
| 5,801,602 A | 9/1998 | Fawal et al. |
| 5,812,597 A | 9/1998 | Graham et al. |
| 5,812,598 A | 9/1998 | Sharma et al. |
| 5,825,259 A | 10/1998 | Harpham et al. |
| 5,831,426 A | 11/1998 | Black, Jr. et al. |
| 5,831,525 A | 11/1998 | Harvey |
| 5,845,190 A | 12/1998 | Bushue et al. |
| 5,850,436 A | 12/1998 | Rosen et al. |
| 5,864,607 A | 1/1999 | Rosen et al. |
| 5,900,683 A | 5/1999 | Rinehart et al. |
| 5,907,481 A | 5/1999 | Svardsjo |
| 5,913,817 A | 6/1999 | Lee |
| 5,926,358 A | 7/1999 | Dobkin et al. |
| 5,945,728 A | 8/1999 | Dobkin et al. |
| 5,952,849 A | 9/1999 | Haigh |
| 5,969,590 A | 10/1999 | Gutierrez |
| 6,049,258 A | 4/2000 | Fawal et al. |
| 6,054,780 A | 4/2000 | Haigh et al. |
| 6,061,009 A | 5/2000 | Krone et al. |
| 6,069,802 A | 5/2000 | Priegnitz |
| 6,082,744 A | 7/2000 | Allinger et al. |
| 6,087,882 A | 7/2000 | Chen et al. |
| 6,104,003 A | 8/2000 | Jones |
| 6,114,937 A | 9/2000 | Burghartz et al. |
| 6,124,756 A | 9/2000 | Yaklin et al. |
| 6,137,372 A | 10/2000 | Welland |
| 6,222,922 B1 | 4/2001 | Scott et al. |
| 6,232,902 B1 | 5/2001 | Wada |
| 6,249,171 B1 | 6/2001 | Yaklin et al. |
| 6,262,600 B1 | 7/2001 | Haigh et al. |
| 6,291,907 B1 | 9/2001 | Haigh et al. |
| 6,307,497 B1 | 10/2001 | Leung et al. |
| 6,384,763 B1 | 5/2002 | Leung et al. |
| 6,389,063 B1 | 5/2002 | Kanekawa et al. |
| 6,452,519 B1 | 9/2002 | Swanson |
| 6,525,566 B2 | 2/2003 | Haigh et al. |
| 6,538,136 B1 | 3/2003 | Rizzo et al. |
| 6,603,807 B1 | 8/2003 | Yukutake et al. |
| 6,611,051 B2 | 8/2003 | Akiyama et al. |
| 6,670,861 B1 | 12/2003 | Balboni |
| 6,720,816 B2 | 4/2004 | Strzalkowski |
| 6,728,320 B1 | 4/2004 | Khasnis et al. |
| 6,747,522 B2 | 6/2004 | Pietruszynski et al. |
| 6,833,800 B1 | 12/2004 | Patterson |
| 6,873,065 B2 | 3/2005 | Haigh et al. |
| 6,902,967 B2 | 6/2005 | Beasom |
| 6,903,578 B2 | 6/2005 | Haigh et al. |
| 6,914,547 B1 | 7/2005 | Swaroop et al. |
| 6,922,080 B2 | 7/2005 | Haigh et al. |
| 6,927,662 B2 | 8/2005 | Kahlmann et al. |
| 6,940,445 B2 | 9/2005 | Kearney |
| 6,956,727 B1 | 10/2005 | Brokaw |
| 6,967,513 B1 | 11/2005 | Balboni |
| 6,977,522 B1 | 12/2005 | Murabayashi et al. |
| 7,012,388 B2 | 3/2006 | Lin et al. |

| | | |
|---|---|---|
| 7,016,490 B2 | 3/2006 | Beutler et al. |
| 7,023,372 B1 | 4/2006 | Singh et al. |
| 7,053,807 B1 | 5/2006 | Gaalaas |
| 7,053,831 B2 | 5/2006 | Dempsey |
| 7,057,491 B2 | 6/2006 | Dempsey |
| 7,075,329 B2 | 7/2006 | Chen et al. |
| 7,102,388 B2 | 9/2006 | Murabayashi et al. |
| 7,315,592 B2 | 1/2008 | Tsatsanis et al. |
| 7,548,675 B2 * | 6/2009 | Tatum et al. ............... 385/100 |
| 7,592,713 B2 * | 9/2009 | Bryan et al. ............... 307/9.1 |
| 7,684,475 B2 * | 3/2010 | Calvin ..................... 375/216 |
| 2008/0285590 A1 * | 11/2008 | Mizuno et al. ............. 370/466 |

FOREIGN PATENT DOCUMENTS

| | | |
|---|---|---|
| FR | 267970 A1 | 1/1993 |
| GB | 2173956 A1 | 10/1986 |
| JP | 57-132460 A1 | 8/1982 |
| WO | 98/22307 A1 | 4/1999 |

OTHER PUBLICATIONS

A Tale of Two Modems, Sensors Magazine, Apr. 2002, pp. 30-32.
Akiyama, Noboru, A High-Voltage Monolithic Isolator for a Communication Network Interface, IEEE Transactions on Electron Devices, May 2002, pp. 895-901, vol. 49, No. 5.
Analog Devices—ADuM130x/ADuM140x; Coupler Technology Removes the Limitations of Optocoupler Solutions, pp. 2-15, May 2003.
Baker, Bonnie C., The Basics of Isolation Circuits, Sensors and Systems, May 1996, pp. 46-47.
Bindra, Ashok, MEMS-Based Magnetic Coils Exceed the Limitations of Optical Couplers, Electronic Design, Jul. 24, 2000, p. 43.
Bourgeois, J.M., "PCB-based Transformer for Power MOSFET Drive," 0-7803-1456-5-94 at pp. 283-244, IEEE, 1994.
Choina, Simon, Planar Transformers Make Maximum Use of Precious Board Space, Electronic Design, Mar. 9, 1999, pp. 97 & 99.
Clark, Ron, RS-232C/422/485 Line Isolation Solves More Than Fault Problems, EDN, Sep. 28, 1995, pp. 103-115.
EDN's 100 Top Products 1994, EDN, Dec. 8, 1994, pp. 58.
Green, M.W. Miniature Multilayer Spiral Inductors for GsAs MMICs, 1989 IEEE GaAs Symposium, 1989, pp. 303-306.
Hoskins, Kevin, Isolated ADC Reduces Power Consumption, EDN, Mar. 30, 1995, pp. 73-74.
Ichio Aoki et al.; Fully Integrated CMOS Power Amplifier Design Using the Distributed Active- Transformer Architecture; IEEE Journal of Solid State Circuits, vol. 37, No. 3, Mar. 2002; pp. 371-383.
IEEE Standard for a High Performance Serial Bus, IEEE Std. 1395-1995, Dec. 1995, pp. 1-392, NY.
Impedance Matching Transformers, Transformer Applications, pp. 72-85, 2001.
Kester, W., Origins of Real-World Signals and Their Units Measurement, ch. 1, pp. 1.1-1.11, 2003.
Kilger, R. et al., "Micromachined magnetics: a new step in the evolution of isolation technology," Electronic Engineering, Jun. 2000 at pp. 27-32.
Klein William, Applications of Signal Isolation, Sensors Magazine, Apr. 2000, pp. 70-74.
Knoedl, G., A Monolithic Signal Isolator, IEEE, 1989, pp. 165-170.
Kojima, Yasuyuki, 2.3 kVac 100 MHz Multi-Channel Monolithic Isolator IC, 2000 Proceedings Annual IEEE International ASIC Conference, 2000, pp. 309-312.
Kojima, Yasuyuki, A Novel Monolithic Isolator for a Communications Network Interface IC, 1998 Proceedings Annual IEEE International ASIC Conference, 1998, pp. 255-258.
Kuhn, William, An RF-Based IEEE 1394 Ground Isolator Designed in a Silicon-on-Insulator Process, 44th IEEE 2001 Midwest Symposium on Circuits and Systems, Aug. 2001, pp. 764-767.
Lam, Sam, High-Isolation Bonding Pad Design for Silicon RFIC up to 20 GHz, IEEE Electron Device Letters, Sep. 2003, vol. 24, No. 5, pp. 601-603.
Long, John R., A 1.9 GHz Low-Voltage Silicon Bipolar Receiver Front-End for Wireless Personal Communications Systems, IEEE Journal of Solid-State Circuits, Dec. 1995, vol. 30, No. 12, pp. 1438-1448.
Long, John R., Monolithic Transformers for Silicon RF IC Design, IEEE Journal of Solid-State Circuits, Sep. 2000, vol. 35, No. 9, pp. 1368-1382.
Mammano, Bob, Isolated Power Conversion: making the case for secondary-side control, EDN, Jun. 7, 2001, pp. 123-127.
Martel, Jesus, Analysis of a Microstrip Crossover Embedded in a Multilayered Anisotropic and Lossy Media, IEEE Transactions on Microwave Theory and Techniques, Mar. 1994, pp. 424-432, vol. 32, No. 3.
Munzer, M. , Coreless transformer a new technology for half bridge driver IC's, pp. 1-4, 2000.
Pickering, Paul, A System Designer's Guide to Isolation Devices, Sensors, Jan. 1999, pp. 14-26.
Ronkainen, H., IC compatible planar inductors on silicon, IEE Proc.- Circuits Devices Syst., Feb. 1997, vol. 144, No. 1, pp. 29-35.
Schweber, Bill, MEMS-Based Digital Isolator Answers Need for Extreme I/O Speed, EDN, Jul. 20, 2000, p. 24.
Schweher, Bill, DAAs go for the Silicon, EDN, Feb. 17, 2000, pp. 119-130.
Simburger, Werner, A Monolithic Transformer Coupled 5-W Silicon Power Amplifier with 59% PAE at .9Ghz, IEEE Journal of Solid-State Circuits, Dec. 1999, vol. 34, No. 12, pp. 1881-1892.
Sorenson, Jeff, Direct-Access Arrangements Are Crucial to Successful Embedded-Modem Designs, Electronic Design, Aug. 20, 2001, pp. 66-78.
Stapleton, Helen, Isolation Techniques for High-resolution Data-acquisition Systems, EDN, Feb. 1, 2000, pp. 113-118.
Tang, S.C., A Low-Profile Wide-Band Three-Port Isolation Amplifier with Coreless Printed-Circuit-Board (PCB) Transformers, IEEE Transactions on Industrial Electronics, Dec. 2001, vol. 48, No. 6, pp. 1180-1187.
Walker, Geoff, An Isolated MOSFET Gate Driver, pp. 1-6, 1996.
Walker, Geoffry, Modulation and Control of Multilevel Converters, Thesis submitted for Doctor of Philosophy (The University of Queensland), Nov. 16, 1999, pp. 1-202.
Ward Titus, John Kenney, "10 GHz VCO for 0.13um CMOS Sonet CDR," Analog Devices, pp. 1-4, Jun. 2006.
Wolfs, P.J., An Improved Transformer Coupled MOSFET/IGBT Driver, Journal of Electrical and Electronic Engineering, Australia—IE Aust. & IREE Aust., Sep. 1991, vol. 11, No. 03, pp. 197-200.
Young, Ron, Feedback Isolation Augments Power-Supply Safety and Performance, EDN, Jun. 19, 1997, pp. 141-146.
Zhou, Jian-Jun and Allstot, David, A Fully Integrated CMOS 900MHz LNA Utilitzing Monolithic Transformers, ISSCC Digest of Technical Papers, pp. 132-133, 1998.
Zhou, Jianjun, Monolithic Transformers and Their Application in a Differential CMOS RF Low-Noise Amplifier, IEEE Journal of Solid-State Circuits, Dec. 1998, pp. 2020-2027.

* cited by examiner

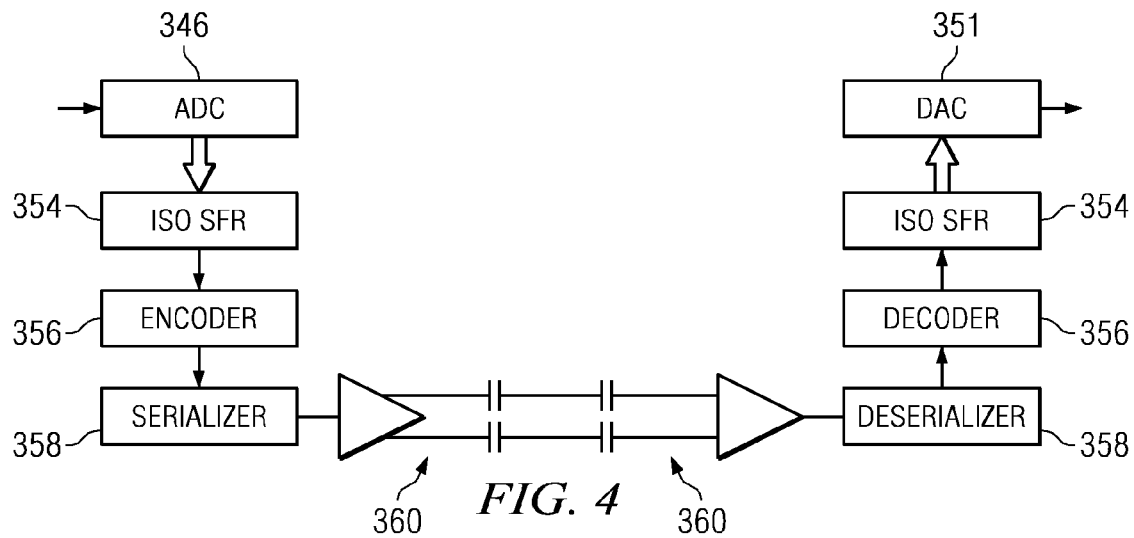
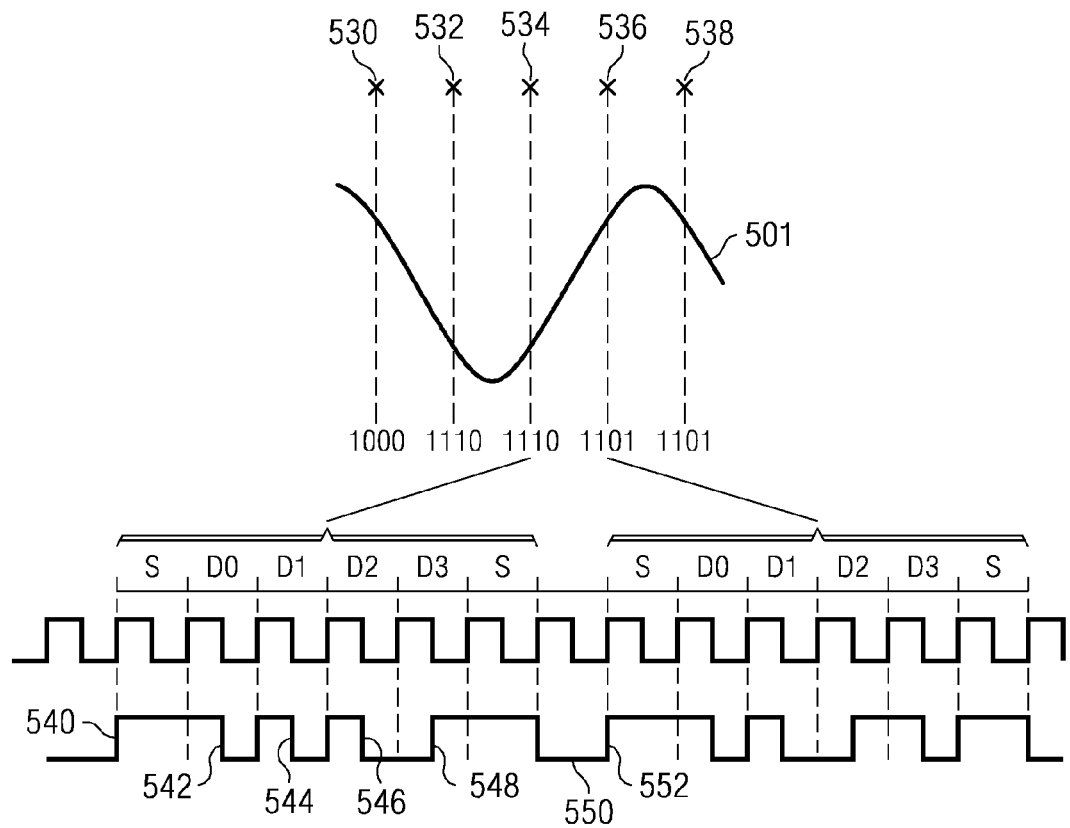
FIG. 5a

MCU WITH INTEGRATED VOLTAGE ISOLATOR AND INTEGRATED GALVANICALLY ISOLATED ASYNCHRONOUS SERIAL DATA LINK

CROSS-REFERENCE TO RELATED

The present invention is a Continuation-in-part of U.S. patent application Ser. No. 12/060,049, filed on Mar. 31, 2008, entitled, "CAPACITIVE ISOLATOR," which is a continuation-in-part of U.S. patent application Ser. No. 11/772,178, filed on Jun. 30, 2007, entitled, "BIDIRECTIONAL MULTIPLEXED RF ISOLATOR," which is a continuation-in-part of application Ser. No. 11/089348, filed on Mar. 24, 2005, now U.S. Pat. No. 7,302,247, issued on Nov. 27, 2007, entitled, "SPREAD SPECTRUM ISOLATOR," which is a continuation-in-part of U.S. patent application Ser. No. 10/860,399, filed on Jun. 3, 2004, now U.S. Pat. No. 7,421,028 entitled, "TRANSFORMER ISOLATOR FOR DIGITAL POWER SUPPLY," and U.S. patent application Ser. No. 10/860,519, filed on Jun. 3, 2004 now U.S. Pat. No. 7,447,492 entitled, "ON-CHIP TRANSFORMER ISOLATOR, and application Ser. No. 11/020977, filed on Dec. 22, 2004, now U.S. Pat. No. 7,376,212, issued on May 20, 2008, entitled, "RF ISOLATOR WITH DIFFERENTIAL INPUT/OUTPUT," and U.S. patent application Ser. No. 11/064,413, filed on Feb. 23, 2005 now U.S. Pat. No. 7,460,604 and entitled, "RF ISOLATOR FOR ISOLATING VOLTAGE SENSING AND GATE DRIVERS," the present invention is related to U.S. patent application Ser. No. 12/164,998, filed Jun. 30, 2008, entitled, "MCU WITH INTEGRATED VOLTAGE ISOLATOR TO PROVIDE A GALVANIC ISOLATION BETWEEN INPUT AND OUTPUT."

TECHNICAL FIELD

The present invention relates to microcontroller units, and more particularly, to a microcontroller unit having an integrated voltage isolation functionality on a single chip.

BACKGROUND

Within power conversion products, medical equipment and communication equipment, there is a need for high speed digital links that provide high voltage isolation at a low cost. Typically, digital links within power conversion products require a speed of 50 to 100 megabytes per second. Isolation between the input and output of power conversion products is required in the range of 2500 to 5000 volts. Existing solutions for providing a high speed digital isolation link have focused on the use of magnetic pulse couplers, magnetic resistive couplers, capacitive couplers and opto couplers. Typically, this isolation is referred to as "galvanic isolation." Galvanic isolation is defined as the principle of isolating functional sections of electric systems so that charge-carrying particles cannot move from one section to another, i.e. there is no electrical current flowing directly from one section to the next. Energy and/or information can still be exchanged between the sections by other means, however, such as by capacitance, induction, electromagnetic waves, optical, acoustic, or mechanical means.

Within a magnetic pulse coupler, a driver on one side of the digital link transmits information over the digital link to a detector residing on the other side of the digital link. Between the driver and the detector is a pulse transformer. The pulse transformer provides an electromagnetically coupled transformer between the driver and the detector. The pulse transformer generates a pulse output in response to a provided input from the driver. The input from the driver consists of two pulses, each pulse consisting of a rising edge and a falling edge. In response to a rising edge, the output of the pulse transformer generates a positive pulse. The falling edge of the pulse generates a negative pulse. The pulse transformer circuit has a number of deficiencies. These include start up where the detector will not know at what point the input from the driver has begun, whether high or low, until a first pulse edge has been detected. Additionally, should any error occur in the pulse output of the pulse transformer, the detector has a difficult time determining when to return to a proper state since there may be a long period of time between pulses. An alternative solution involves the use of a magneto resistive coupler. The magneto resistive coupler consists of a resistor and an associated transformer. The resistor has a resistance value that changes responsive to the magnetic flux about the resistor. The transformer detector utilizes a Wheatstone bridge to detect the magnetic flux of the resistor and determine the transmitted data.

Opto couplers are the dominant voltage isolation technology used in the market today. The use of opto couplers is mandated by various safety standards and the increasing complexity of systems requires increased voltage isolation needs. However, the opto couplers have several deficiencies. They are large, slow and their operating characteristics vary with temperature and age. They also require a high power of greater than 5 volts to operate. Switching the LED at higher speed is difficult and takes even more power. Additionally, they are discrete components which are not easily integrated with integrated circuits.

Thus, within isolation technologies there is a need to provide more flexibility with voltage isolation circuitries. The large number of complex system applications that require voltage isolation capabilities have required a number of different solutions such as those described above to be implemented. However, a more flexible solution that is capable of being utilized across a number of different applications would greatly benefit circuit designers requiring improved tools for voltage isolation situations.

SUMMARY

The present invention as disclosed and described herein, in one aspect thereof, comprises an integrated circuit. The integrated circuit comprises a first microcontroller unit for executing instructions in accordance with a first clock frequency. The microcontroller located on a first die and includes a first processing core for providing a parallel stream of data in accordance with the first clock frequency. A second microcontroller unit executes instructions in accordance with the first clock frequency. The second microcontroller is located on a second die and includes a second processing core for receiving the parallel stream of data in accordance with the first clock frequency. Capacitive isolation circuitry connected with the first microcontroller unit and the second microcontroller unit provides a high voltage isolation link between the first and the second microcontroller units. The capacitive isolation circuitry distributes a first portion of a high voltage isolation signal across a first group of capacitors associated with the first microcontroller unit and distributes a second portion of the high voltage isolation signal across a second group of capacitors associated with the second microcontroller unit. The capacitive isolation circuitry further transmits data from the parallel data stream between the first microcontroller and the second microcontroller in a serial data stream in accordance with the second clock frequency.

BRIEF DESCRIPTION OF THE DRAWINGS

For a more complete understanding, reference is now made to the following description taken in conjunction with the accompanying Drawings in which:

FIG. 4 more particularly illustrates the components for transmitting information across a voltage isolation link between a first and second microcontroller devices with integrated voltage isolation circuitry;

FIG. 5a is a timing diagram illustrating the manner for sampling a digital signal and generating a Manchester encoded output from a sampled analog signal;

DETAILED DESCRIPTION

Figure 1:
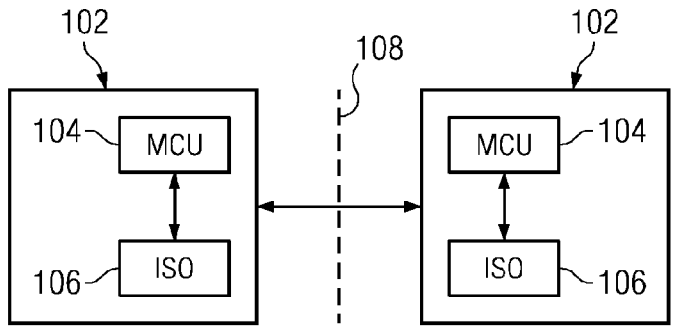
FIG. 1 is a block diagram illustrating an interconnection of a pair of integrated circuits including an MCU with integrated voltage isolation functionalities.

Referring now to the drawings, wherein like reference numbers are used herein to designate like elements throughout, the various views and embodiments of this MCU with integrated voltage isolator are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Referring now to FIG. 1, there is illustrated a pair of microcontroller integrated circuits 102 that each include an internal MCU 104 and voltage isolation circuit 106 integrated with the MCU 104 within a single chip. Using the voltage isolation circuitry 106, the MCUs 104 may communicate with each other across a voltage isolation barrier 108. Further, the integrated circuits provide a monolithic solution whereby the MCU functionality and the isolation are integrated on a common silicon chip using the same process. Typically, the process is a CMOS process for realizing the mixed signal functionality of the MCU and the Flash memory and the voltage isolation is also realized within the constraints of such a process.

Figure 2A:
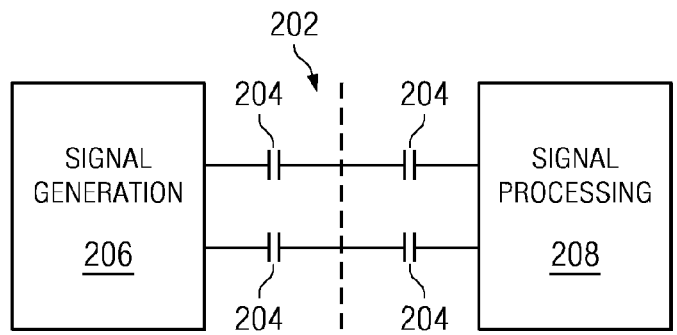
FIG. 2a illustrates a pair of MCUs with integrated voltage isolation functionality wherein the voltage isolation is provided by capacitive isolation circuitry.
Figure 2B:
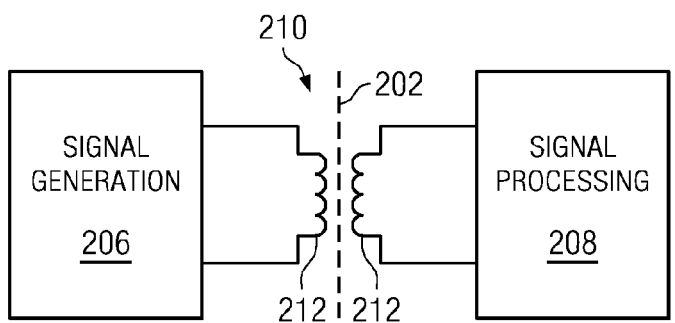
FIG. 2b illustrates a pair of MCUs including voltage isolation circuitry wherein an RF isolator is used.

Referring now to FIGS. 2a and 2b, the voltage isolation circuitry 106 that enables transmission of data between the microcontroller integrated circuits 102 across a voltage isolation barrier 108 may be configured in a number of formats. In the configuration illustrated in FIG. 2a, a capacitive isolation link 202 is used consisting of four capacitors 204. A first pair of capacitors 204 is associated with the signal transmission circuitry 206 that enables, responsive to the receipt of various types of data, the transmission of the data across the capacitive isolation link 202 to signal receiving circuitry 208. The signal receiving circuitry 208 is responsible for detecting the data included within the information transmitted across the capacitive isolation link 202 and forwarding this information on to the appropriate locations. Each capacitor 204 on either side of the isolation link absorbs ½ of the voltage across two microcontrollers. Thus, the dielectric of each of the capacitors 204 can be realized with a dielectric with a lower breakdown voltage, thus allowing conventional CMOS processing to be utilized. In this manner, specialized high voltage processes do not need to be implemented to achieve the required 2500 V to 5000 V voltage isolation.

In addition to the capacitive isolation circuitry illustrated in FIG. 2a, an RF isolation link 210 as illustrated in FIG. 2b may be utilized. The RF isolation link 210 also enables the transmission of data across the voltage isolation barrier 108 from signal transmission circuitry 206 to the signal receiving circuitry 208. In this case, the RF isolation link 210 consists of a pair of inductors 212 that inductively couple the information across the voltage isolation barrier 108. The particular configurations of the capacitive isolation link 202 and the RF isolation link 210 will be more fully described herein below.

Figure 3:
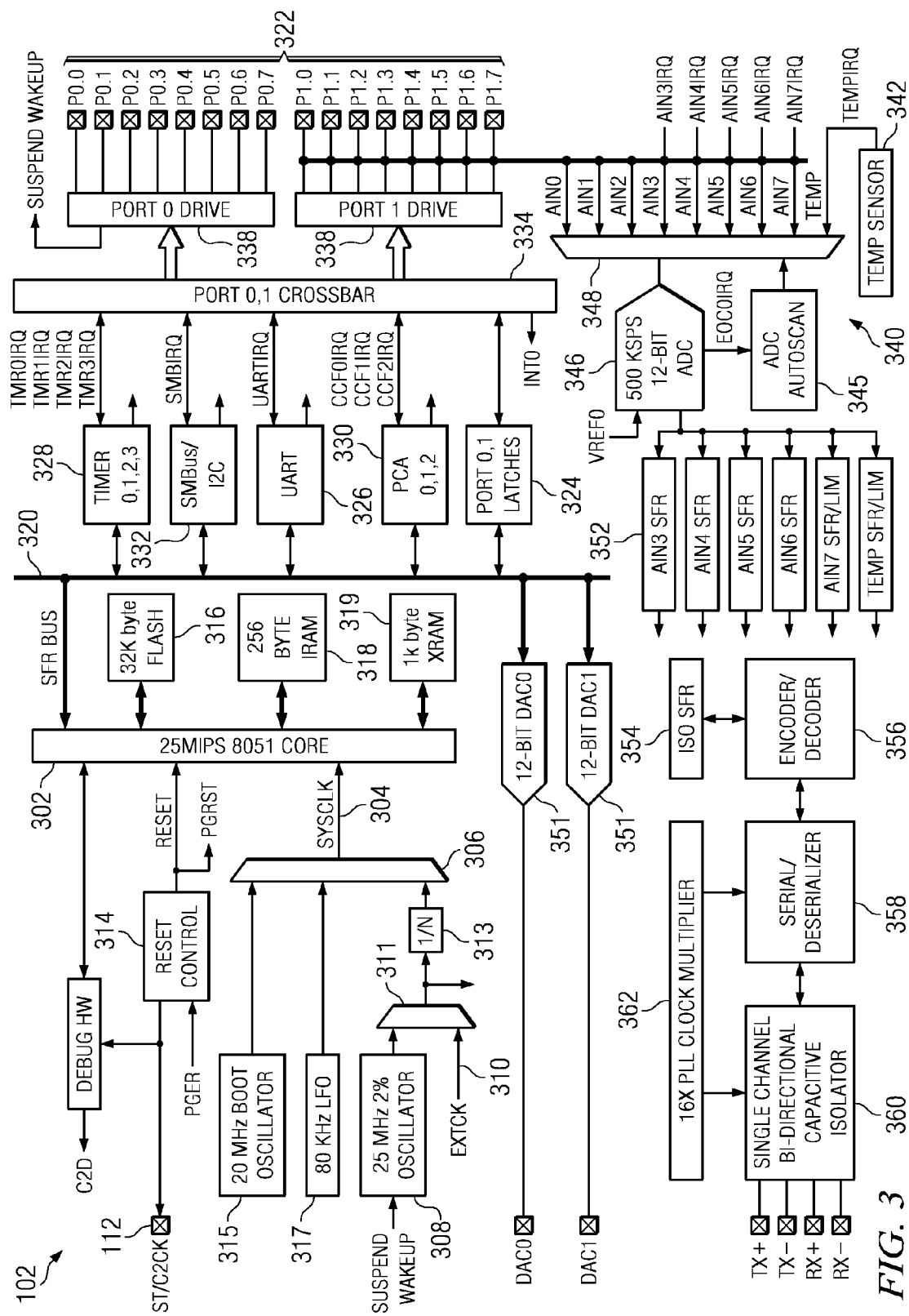
FIG. 3 illustrates the microcontroller unit including integrated voltage isolation circuitry.

Referring now to FIG. 3, there is illustrated a block diagram of a microcontroller unit integrated circuit (MCU) 102 including integrated voltage isolation circuitry. The MCU 102 is generally of the type similar to the family of part numbers C8051F300 manufactured by Silicon Laboratories Inc, which are generally referred to as "8051 mixed signal controllers." The MCU 102 includes a processing core 302 which is typically comprised of a conventional 8-bit microprocessor of the type "8051." The processing core 302 receives a clock signal on line 304 from a multiplexer 306. The multiplexer 306 is operable to select among multiple clocks. There is provided a 25 MHz trimmable internal precision oscillator 308 for an external clock signal on line 310. These clocks are provided through a multiplexer 311, which enables the selection of one of the clock signals and is next input to a 1/n divider circuit 313. The precision oscillator 308 is described in U.S. Patent Application Publication No. 2004/0054835 entitled "PRECISION OSCILLATOR FOR AN ASYNCHRONOUS TRANSMISSION SYSTEM," filed Sep. 16, 2002, which is incorporated herein by reference in its entirety. The system clock provided on line 304 may also be selected by the multiplexer 306 from a 20 MHz boot oscillator signal 315 or an 80 KHz low frequency oscillator 317. The processing core 302 is also operable to receive an external reset on a test terminal that is provided to a reset control circuit 314.

The processing core 302 has associated therewith a plurality of memory resources, those being either a 32 kilobyte FLASH memory 316, a 256 byte IRAM memory 318 or a 1 kilobyte XRAM memory 319. The processing core 302 interfaces with various digital and analog peripherals via an SFR bus 320. The SFR bus 320 is a special function register bus that allows the processing core 302 to interface with various operating pins 322 that can interface externally to the chip to receive digital values, output digital values, receive analog values or output analog values. Various digital I/O peripherals are provided, these being a UART 326, timers 328, PCA 330, SMBus/I²C Bus interface circuit 332 and various port latches 324. Also interfacing with the plurality of output pins 322 via the SFR bus 320 are a pair of 12-bit digital-to-analog controllers 351.

All of these peripherals are interfaceable to the output pins 322 through a cross bar decoder 334, which is operable to configurably interface these devices with selected ones of the output pins 322 responsive to control signals from the cross bar control. Port drivers 338 are used for driving the signals received from the priority cross bar decoder 334 to the output pins 322. The cross bar decoder 334 is described in U.S. Pat. No. 6,839,795, which is incorporated herein by reference.

The input/output pins 322 to/from the digital peripherals 324-332 are also interfaced to analog peripherals 340. The analog peripherals 340 include an analog-to-digital converter 346 for receiving analog input signals from an analog multiplexer 348 interfaced to the plurality of input pins on the MCU 302. The analog multiplexer 348 allows the multiple outputs to be sensed through the pins 322 such that the analog-to-digital converter 346 can be interfaced to various sensors, such as a temperature sensor 342. The operation of the multiplexer 348 may also be controlled by an ADC auto scan function 345.

The output of the analog-to-digital converter 346 may be provided to a number of SFR registers 352. Responsive to information stored in the analog SFR registers 352, an interrupt may be generated to download the stored information to an isolator SFR register 354. The isolator SFR register 354 generates an interrupt when it contains a byte of data to be transmitted. Once the interrupt is generated, the data within the ISO SFR register 354 is downloaded in parallel to encoder/decoder circuitry 356. In the preferred embodiment, the encoder/decoder circuitry 356 comprises a Manchester encoder for encoding/decoding information transmitted over the voltage isolation link and information received on the voltage isolation link. The operation of the Manchester encoder 356 will be more fully described herein below. It will, of course, be realized by those skilled in the art that other types of encoding/decoding circuitries may be utilized for the transmission of information across the voltage isolation link.

Once the information has been encoded by the encoder 356, the information is provided to a serializer/deserializer circuit 358. The serializer/deserializer circuit 358 receives information from the encoder/decoder circuit 356 in parallel format and outputs it to the single channel bidirectional capacitive isolator circuit 360 in a serial format. In the receive mode of operation, the serializer/deserializer 358 receives serial data from the isolator circuit 360 and outputs it in parallel format to the encoder/decoder circuit 356 for decoding thereby in parallel format.

The single channel bidirectional capacitive isolator 360 is of the type described in U.S. patent application Ser. No. 12/060,049 entitled "CAPACITIVE ISOLATOR," filed on Mar. 31, 2008, which is incorporated herein by reference. This will be more fully described herein below. Each of the serializer/deserializer circuit 358 and the capacitive isolator 360 are clocked using a much higher clock rate than that utilized to clock the CPU, this generated with the use of a 16× PLL clock multiplier circuit 362. The 16× PLL clock multiplier 362 receives the clock signal from the multiplexer 311 which in the standard operating mode would comprise the 25 MHz oscillator signal. This is multiplied by a factor of sixteen to provide a 400 MHz clock signal for the serialization operation of the encoder/decoder 356 and operation of the capacitive isolator 360. This will enable transmission across the capacitive isolation link at a higher data rate in a serial format as compared to the data rate of the parallel data, as the samples are generated in a parallel data format at a defined sample rate and must be capable of being serialized and transmitted across the isolation boundary in real time or with minimum latency.

Referring now also to FIG. 4, there is more particularly illustrated the manner in which information may be transmitted over the capacitive isolation link from one microcontroller unit including voltage isolation circuitry to another. Analog data is provided to the analog-to-digital converter 346 within an MCU 102 which samples the analog input at a predefined sampling rate and generates a digital value therefore. This digital word is stored within the isolator SFR register 354. The data stored within the isolator SFR register 354 causes the register 354 to generate an interrupt to the processing core 302 which will instruct the isolator SFR register 354 to download its presently stored sample into the encoder 356. The encoder 356 performs Manchester encoding or some other type of applicable encoding process to generate a parallel output stream of encoded data that is input to the serializer 358. The serializer 358 receives the encoded data in parallel and outputs the received data to the voltage isolation circuitry of the associated MCU 102 in serial format. The data is transmitted from the voltage isolation circuit 360 of one integrated microcontroller circuit to the voltage isolation circuit 360 of a receiving microcontroller circuit a single bit at a time and at a substantially higher bit rate that the sample rate. The received data is provided to a deserializer circuit 358 at the receiving microcontroller integrated circuit and the serialized data is converted from a serial format to a parallel format that is output to the decoder circuit 356. The decoder circuit decodes the information within the received data that has been Manchester encoded to provide the digital data that was originally encoded by the encoder 356. (With Manchester encoding, the clock is recovered from the data.) This decoded information is output in parallel to the ISO SFR register 354 and stored therein until an interrupt generated by the SFR 354 enables the data to be processed by a digital-to-analog converter 351 wherein the digital sample is converted back into an analog signal.

As described, the encoder/decoder circuit 356 may use Manchester encoding for encoding the received data. In order to enable synchronous transmission of information across the voltage isolation link there must be some type of synchronization between the data clocks on both sides of the voltage isolation boundary. This can be facilitated in two ways. The first way is to actually transmit the data on a single line and the clock signal on a separate line. These are conventional serial data protocols. One such serial data protocol is referred to as I²C. Another is referred to as RS232. Each of these two serial data protocols requires a separate clock line in order to transmit the data. With this separate clock line, of course, the recovery of data is trivial and also allows the data rate to be increased.

In the second type of synchronous serial data transfer, i.e., that not having a separate clock line, the data is transferred across the voltage isolation boundary with no separate clock signal. Therefore, there must be a way for the receive side to extract the data and the timing information from the signal. Typically, there must be some type of clock on the receive side that generates a sample signal that has some knowledge of the period in time during which to sample the data line wherein the data is valid. One type of serial data protocol is Manchester-coded data which utilizes clock recovery. This requires some type of start bit to indicate that a frame of data, i.e., a byte, is being transmitted, after which the data is transmitted in such a manner that clock information can be recovered from the actual data stream. Once the byte of data is transmitted, a stop bit is then sent.

In the embodiment described in the current disclosure, Manchester-coded data is utilized. Manchester encoding/decoding is well known in the art. Since the data may result in the transmission of a byte of data that is, for example, "00111011," there can be at least two adjacent logic "1" states. Manchester-code represents binary values by transitions rather than the level, as would be found in a non-return to zero (NRZ) scheme. The transition occurs at mid-bit, with a low-to-high transition used to represent a logic "0" and a high-to-low transition to represent a logic "1." Depending on the data stream, there may be a transition at the cell boundary (beginning/end). A pattern of consecutive "1s" or "0s" results in a transition on the cell boundary. When the data pattern alternates between "1" and "0" there is no transition on the cell boundary. The mid bit transition in Manchester-code provides a self-clocking feature of a code. This can be used to improve synchronization over non-self clocking code such as NRZ. The transition also allows additional error detection to be done with relatively little circuitry. Again, this is a conventional coding technique across a single serial communication boundary such that no separate clock path is required.

With Manchester-coding there must be some type of synchronization on the receive side. In a Manchester decoder, center sampling occurs at points ¼ and ¾ through the cell, since transitions occur always at mid-bit and sometimes on the cell boundaries. In addition to center sampling, the receiver in a Manchester decoder does the clock recovery. Since Manchester encoding has transitions at least once each data cell, the receiver has known references to which it can resynchronize at each bit. To synchronize to an incoming serial data stream the receiving circuitry in a Manchester decoder can use a digital phase lock loop or a counter algorithm. Digital phase locked loops are most often used in networks with a ring topology while counter algorithm are common in point-to-point links. An example of a counter algorithm which utilizes a 16× clock requires for the first step after receiving the initial transmission of the Manchester data to count the 16× clock to four and then sample. The count of four is known as the n count. At this time, the n count is ¼ through the data cell. Thereafter, the counter is reset to "0" and counting with the 16× clock is begun with an n count of 8, followed by a sample. If there is a transition on the Manchester data, the counter is reset and this sequence is repeated. When initialized correctly to the Manchester data, this algorithm causes the counter to use an n count equal to four when consecutive "1s" or "0s" are transmitted and an n count equal to 8 when alternating "1s" and "0s." Thus, Manchester-coding synchronizes on a bit basis. The result of utilizing Manchester-coding techniques is that there is no DC component and it is well suited to be transformed or AC coupled. Of course, as compared to an NRZ coding technique, Manchester-coding requires the modulation at a rate twice that of NRZ.

In order to transmit a frame of data with Manchester-coding techniques, there must be some type of framing start bit, a framing data bit and a stop bit. As with a UART technology, a start bit at the beginning of a frame can utilize a sequence of a signal start bit, the eight data bits (for an eight input multiplexed system), an optional parity bit and one or more stop bits. This, of course, requires the receive side to be set up to recognize the beginning of a frame with a start bit which could be a sample of a sequence of logic "1s" or a single bit. At the end of the sequence, the stop bit could be a single bit or a sequence of bits wherein, when the output goes low, this indicates the end of transmission of a particular frame. This will be described in more detail below.

Figure 5B:
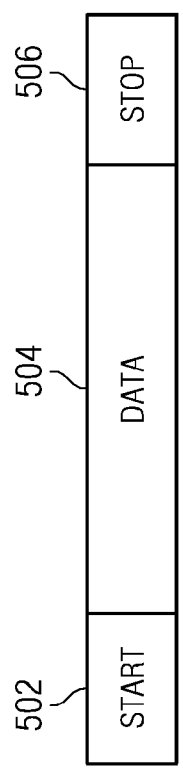
FIG. 5b illustrates a frame of data using the Manchester encoding process.

Referring now also to FIG. 5a, there is illustrated a more detailed diagrammatic view of the sampling and Manchester encoding operation. The illustration in FIG. 5a illustrates the conversion of an analog signal 501 into a 4-bit data signal but in the preferred embodiment, the analog signal would be sampled using an 8-bit sample. The 4-bit sample is merely used for purposes of simplifying the description and illustration, but any bit resolution could be used. Each sample will create a 4-bit data word that is transmitted from the analog-to-digital converter 346 to the isolation SFR register 354 for each sample.

At any given point in time, there will be created a first sample 530. At this point in time, the ADC conversion process creates a sample output word of "1000" which constitutes the sampled data at that point in time. At a second and later sample 532, a second sample is made resulting in a sample word "1110." At a third sample time 534, a sample word of "1110" is generated. At a fourth sample time 536, the sample word created is "1101." At a fifth sampling point 538, the sample word of "1101" is created. This sampling is continuous across the received analog signal by the analog-to-digital converter 346.

For each sampled word, prior to the next sample being taken, the data word is loaded into the isolation SFR register 354 for encoding and serializing for transmission across the isolation barrier. This is facilitated, as described herein above, with Manchester encoding. This is illustrated in detail at the bottom of FIG. 5a. In this embodiment, there will be required start bits 502, data bits 504 and stop bits 506 as illustrated generally in FIG. 5b. For the sample 534, as one example, the start bits will be raised high at a transition 540 and will be maintained high for one full cycle of the data clock. As noted herein above, the data clock for Manchester encoding is twice that for NRZ, as there must be a transition at the mid point. The synchronizer on the opposite side, i.e., the receive side, will recognize the transition 540 and the lack of a transition at the mid point, keeping in mind that data clocks are synchronized. At the first data bit, which is a logic "1," there will be a negative transition 542 at the mid point. Since the next two bits are a logic "1," there will be respective negative transitions 544 and 546 at the mid points thereof. However, the next logic bit is a logic "0" which will result in a positive transition 548 at the mid point thereof. When the stop bit is arrived at, it will be held high for a full clock cycle of the data clock. Thereafter, there will be a logic low during the entire clock cycle, represented by the reference numeral 550. This will then be followed by a positive transition 552 for the start bit of the next word associated with the sample 536. This will continue on in that sequence.

It should be understood that a separate channel with capacitive isolation could be provided for the clock signal such that NRZ data, for example, could be utilized. Any type of data transmission that is serial in nature, as opposed to static, could be realized with one or more capacitive isolation channels (or even inductively coupled channels).

Figure 6:
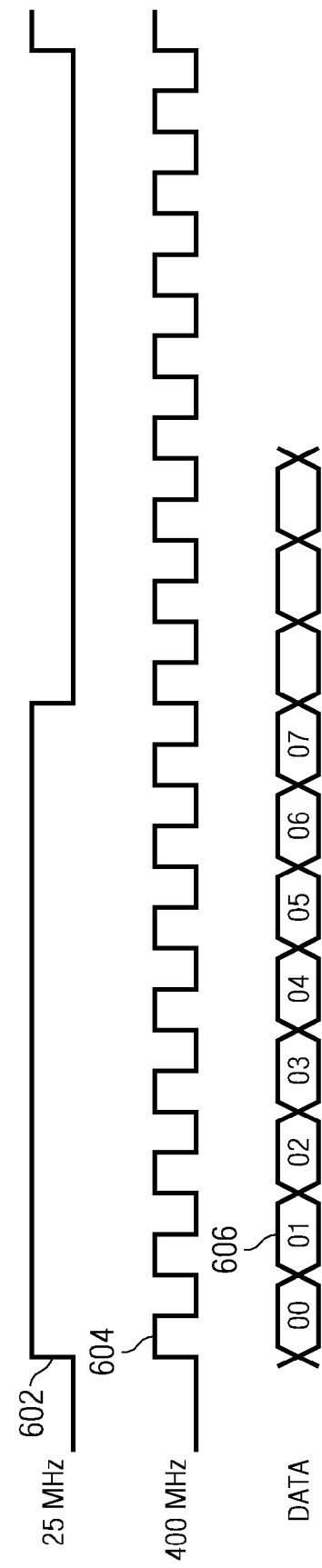
FIG. 6 is a timing diagram illustrating the manner in which the clock signal for encoding and serialization of data across the voltage isolation link is increased from the sampling rate of the information being transmitted.

Referring now to FIG. 6, there are more particularly illustrated the clock signals used for generation of the data that is transmitted across the capacitive isolation link of the microcontroller unit. The data and samples that are generated by the ADCs and DACs within the microcontroller unit operate according to the 25 MHz internal oscillation clock associated therewith. This is illustrated generally at 602. The operation of the encoder/decoder 356 and the serializer/deserializer 358 are according to the 16× PLL clock multiplier circuit 362 that provides timing for these circuitries. Thus, these circuits operate according to a 400 MHz clock signal as indicated generally at 604. The data that is transmitted across the capacitive isolation link is transmitted according to a 400 MHz clock as indicated generally at 606 such that the serially transmitted data is not delayed too far behind the parallel bits that are being sampled according to the 25 MHz clock.

Figure 7:
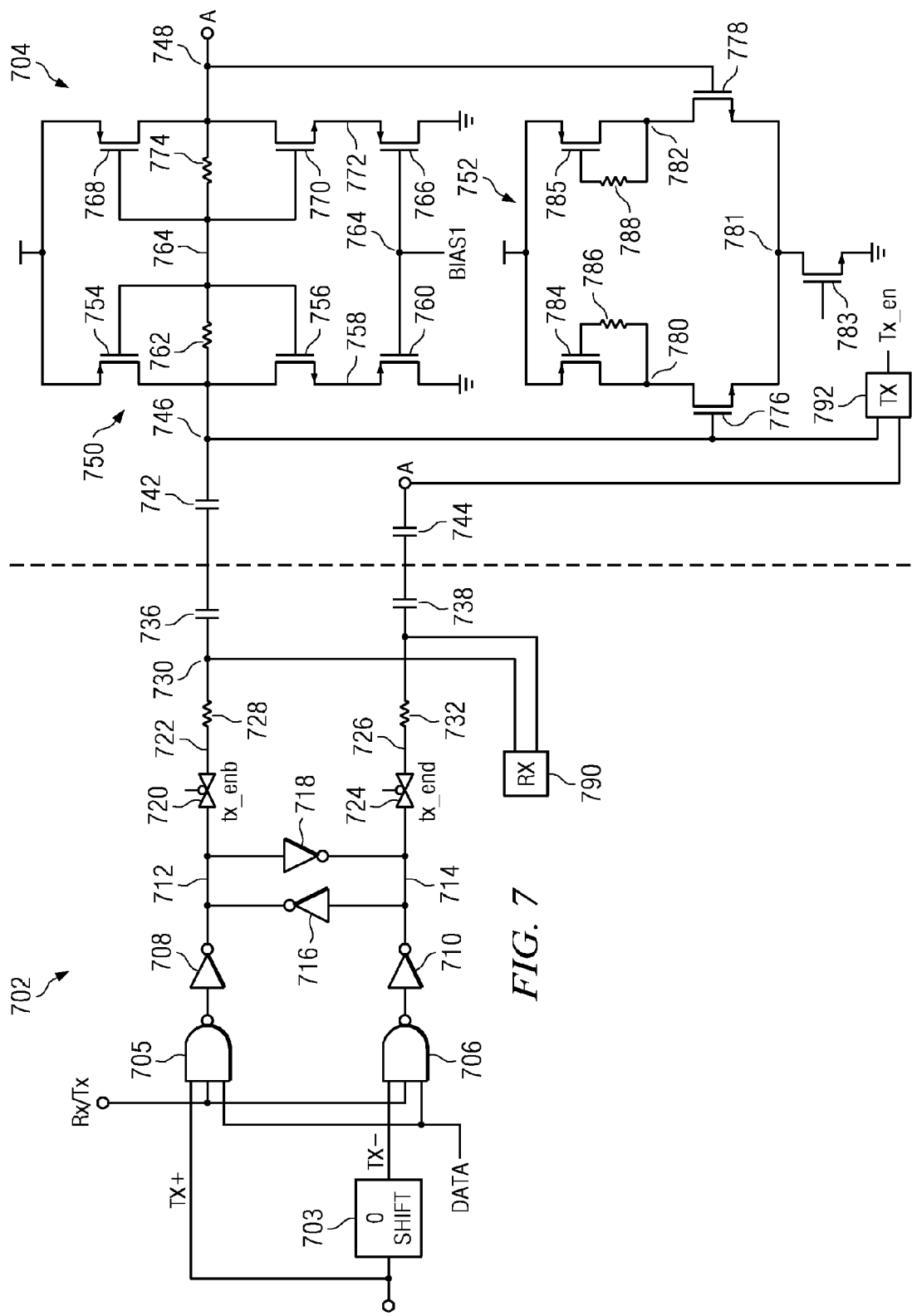
FIG. 7 is a schematic diagram illustrating circuitry for providing the capacitive bidirectional isolation link using amplitude modulation.

The capacitive isolation circuitry used for transmitting the information in a voltage isolated fashion is more particularly illustrated in FIG. 7. The capacitive isolation link 700 consists of transmitter circuitry 702 and receiver circuitry 704 (a differential receiver). The transmitter circuitry 702 consists of a pair of NAND gates 705 (a differential driver) and 706 having first inputs connected to receive the data to be transmitted over the capacitive isolation link and a second input connected to receive an RF carrier signal (16 Hz). In addition to RF signals it is noted that other types of AC (alternating current) signals may be used for the transmissions. The RF carrier signal applied to NAND gate 706 first goes through a phase shifter 703 which phase shifts the RF carrier 180 degrees. The output of each of the NAND gates 705 and 706 are connected to the inputs of inverters 708 and 710 respectively. The output of each of the inverters 708 and 710 are connected to nodes 712 and 714, respectively. An inverter 716 has its input connected to node 714 and its output connected to node 712. A second inverter 718 has its input connected to node 712 and its output connected to node 714. A first transmission gate 720 has its input connected to node 712 and its output connected to node 722. A second transmission gate 724 has its input connected to node 714 and its output connected to node 726. A resistor 728 is connected between node 722 and node 730. A second resistor 732 is connected between node 726 and node 734. Node 730 is connected with a first isolation capacitor 736 and node 734 is connected with a second isolation capacitor 738. The transmission gates 720 and 724 are enabled when the differential driver circuit is transmitting data over the capacitive isolation link. The RF transmission signal is continually applied to one input of NAND gates 705 and 706. When a 1-bit is also transmitted on the other input of the NAND gates 705 and 706, the RF signal is transmitted over each of the transmission lines of the capacitive isolation link with the RF signal on the TX− line being 180 degrees out of phase with the RF signal on the TX+ line. When a 0-bit is applied to the inputs of NAND gates 705 and 706, no RF signal is transmitted over the capacitive link.

The capacitors 736 and 738 are connected across an isolation barrier 740. The isolation barrier may be between different chips or different dies in a single package. Capacitors 736 and 738 connect across the isolation barriers with isolation capacitor 742 and 744, respectively. Capacitors 742 and 744 are associated with the receiver circuitry 704. Capacitor 742 connects with the receiver circuitry at node 746. Capacitor 744 connects with the receiver circuitry at node 748. The receiver circuitry 704 comprises a differential receiver consisting of a bias and transient common mode clamp circuitry 750 for preventing the receiver node from floating and limiting the input common mode voltage to the receiver from exceeding the operating range of the receiver protecting a receiver amplifier 752. The receiver amplifier 752 detects a received signal. The bias and transient clamp circuitry 750 comprises a P-channel transistor 754 having its source/drain path connected between $V_{DD}$ and node 746. An N-channel transistor 756 has its drain/source path connected between node 746 and node 758. A P-channel transistor 760 has its source/drain path connected between node 758 and ground. A resistor 762 is connected between node 746 and node 764. The gates of each of transistors 754 and 756 are connected to node 764. The gate of transistor 760 connects with the gate of a transistor 766 which is connected to a circuit (not shown) providing a bias voltage BIAS 1. Transistor 768 is a P-channel transistor having its source/drain path connected between $V_{DD}$ and node 748. An N-channel transistor 770 has its drain/source path connected between node 748 and node 772. The P-channel transistor 766 having its gate connected with transistor 760 has its source/drain path connected between node 772 and ground. The gates of each of transistors 770 and 756 are connected to node 764. A resistor 774 is connected between node 748 and node 764. The bias and common clamp circuitry 750 clamps the receive input nodes to keep them from floating when no RF signal is applied and clamps the input voltage to the receiver.

The receiver amplifier 752 interconnects with the isolation capacitors at nodes 746 and 748 respectively. These nodes are connected with the gates of N-channel transistors 776 and 778. Transistor 776 is connected between nodes 780 and 781. Transistor 778 has its drain/source path connected between node 782 and node 781. A transistor 783 has its drain/source path connected between node 781 and ground. The gate of transistor 783 is connected to bias circuitry (not shown) providing a bias voltage BIAS 2. A P-channel transistor 784 has its source/drain path connected between $V_{DD}$ and node 780. A transistor 785 has its source/drain path connected between $V_{DD}$ and node 782. A resistor 786 is connected between the gate of transistor 784 and node 780. A resistor 788 is connected between the gate of transistor 785 and node 782. The receive signals over the capacitive link can be detected at either of nodes 780 and 782 and the received signals are offset from each other by 180 degrees.

There will be a receiver 790 connected on the left side of the isolation boundary 740 to the bottom plates of capacitors 736 and 738 and a transmitter 792 on the right side of isolation boundary 740 connected to the bottom plates of capacitors 742 and 744. In this manner, directional control can be provided by either a bonding option to connect the tx_en to a logic "high" or "low" to determine direction or have it determined by the respective MCU.

Figure 8:
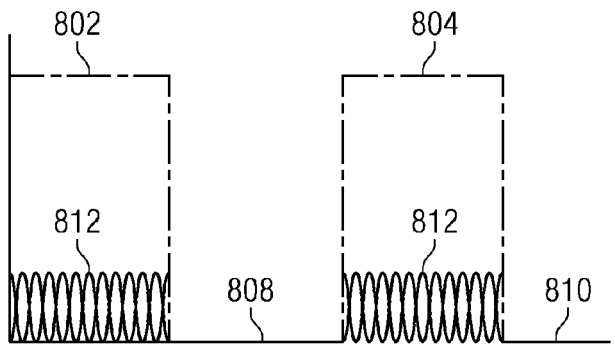
FIG. 8 illustrates the wave form present on the transmit side of the capacitive isolation link of FIG. 7.
Figure 8A:
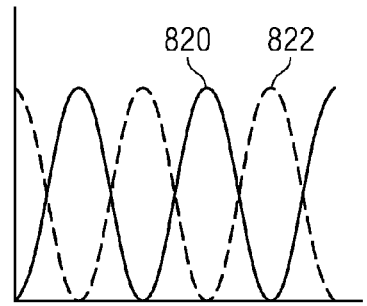
FIG. 8a illustrates a detail view on the transmit side of the wave form of FIG. 8.
Figure 9:
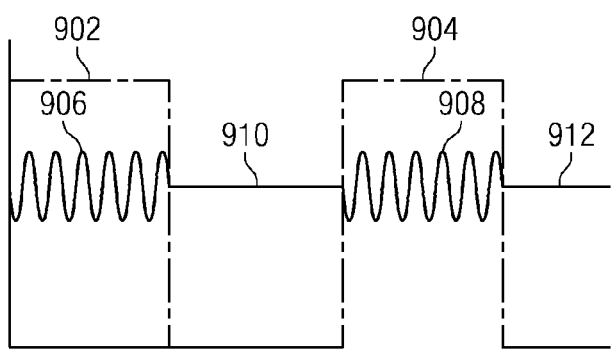
FIG. 9 illustrates the wave forms present on the receiving side of the capacitive isolation link of FIG. 7.

Referring now to FIGS. 8, 8a and 9, there are illustrated the waveforms and data provided at the transmission side (FIGS. 8 and 8a) of a capacitive isolation link and the receive side (FIG. 9) of a capacitive isolation link. On the transmission side illustrated in FIG. 8, the data is either transmitted as a one bit (high) or zero bit (low). A one bit pulse is indicated at 802 and 804. A zero bit pulse is indicated at 808 and 810. The transmit data provided to the capacitive link is illustrated by the waveform 812. The transmit data waveform represents the 1 GHz RF carrier signal. When a logical "1" data bit is being transmitted and the data signal is high, the presence of the RF carrier is provided at the transmit data output. The RF carrier signal can be of any frequency. The use of different frequencies enables the provision of lower power circuitries with lower frequencies. When a logical "0" bit is being transmitted, the signal is virtually zero at the transmit data output. Thus, whether a logical "1" bit or a logical "0" bit is transmitted is indicated either by the presence or absence of the RF carrier signal.

FIG. 8a illustrates the manner in which the wave form 812 is transmitted on each of the transmission lines of the capacitive link. A first RF signal 820 comprises the information transmitted on the TX+ line of the capacitive link from the differential driver. The wave form 822 comprises the inverted format of the RF signal on the TX− line that is 180 degrees out of phase with signal 820.

FIG. 9 illustrates the waveforms associated with the receiver 704. The received data for the logic "1" bit is represented at points 902 and 904 and indicates the two 1 GHz RF carrier pulses transmitted from the transmitter 702 of the capacitive isolation link. The received pulses are amplified by the amplifier 752 such that the pulses are represented by the amplified waveform pulses 906, 910, 912 and 908. The detector data output rises to $V_{DD}$ at points 910 and 912 when no RF carrier signal is detected indicating a logical "0." When an RF carrier signal is detected, the output of the detector 704 begins to vary at points 906 and 908 indicating a logical "1," this being the result of an increase in the NMOS current in transistors 776 and 778.

Figure 10:
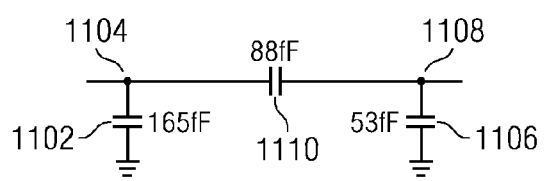
FIG. 10 illustrates a model of one of the capacitive isolation links.

Referring now to FIG. 10, there is illustrated a model for the capacitors 736, 742, 738 and 744. Capacitor 1102 represents a 165 fF capacitor connected between node 1104 and ground. Capacitor 1106 represents a 53 fF capacitor connected between node 1108 and ground. The connection between node 1104 and node 1108 is represented by an 88 fF capacitor 1110.

Figure 11:
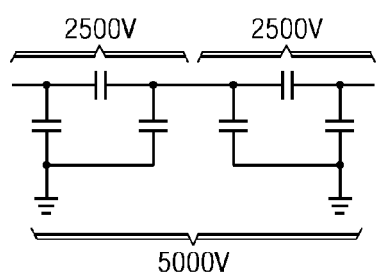
FIG. 11 illustrates the voltages across each capacitor included within a capacitive isolation link and across the entire capacitive isolation link.

Using the RF isolation links described above, voltage isolation of up to 5,000 volts may be achieved, 2,500 volts for each side. Thus, as illustrated in FIG. 11, the RF isolation circuit may provide 5,000 volts of isolation between a first MCU and a second MCU. While the voltage between the input terminals of the first MCU will be zero volts and the voltage between the input terminals of the second MCU will also be zero volts, the total voltage difference between the two MCUs may be 5,000 volts with a 2,500 voltage difference across each of the capacitors associated with the interfaces to the capacitive isolation circuit on each MCU. (Note that this requires each capacitor to only provide a capacitor dielectric with a breakdown voltage in excess of 2,500 Volts.)

While the preferred embodiment of the present invention envisions utilizing the capacitive isolator circuit described herein above with respect to FIG. 7, the use of other types of voltage isolation circuitry such as an integrated voltage isolation circuitry using an RF isolator such as that described in U.S. patent application Ser. No. 11/772,178, entitled "BIDIRECTIONAL MULTIPLEXED RF ISOLATOR," filed on Jun. 30, 2007, which is incorporated herein by reference, may also be utilized.

Figure 12:
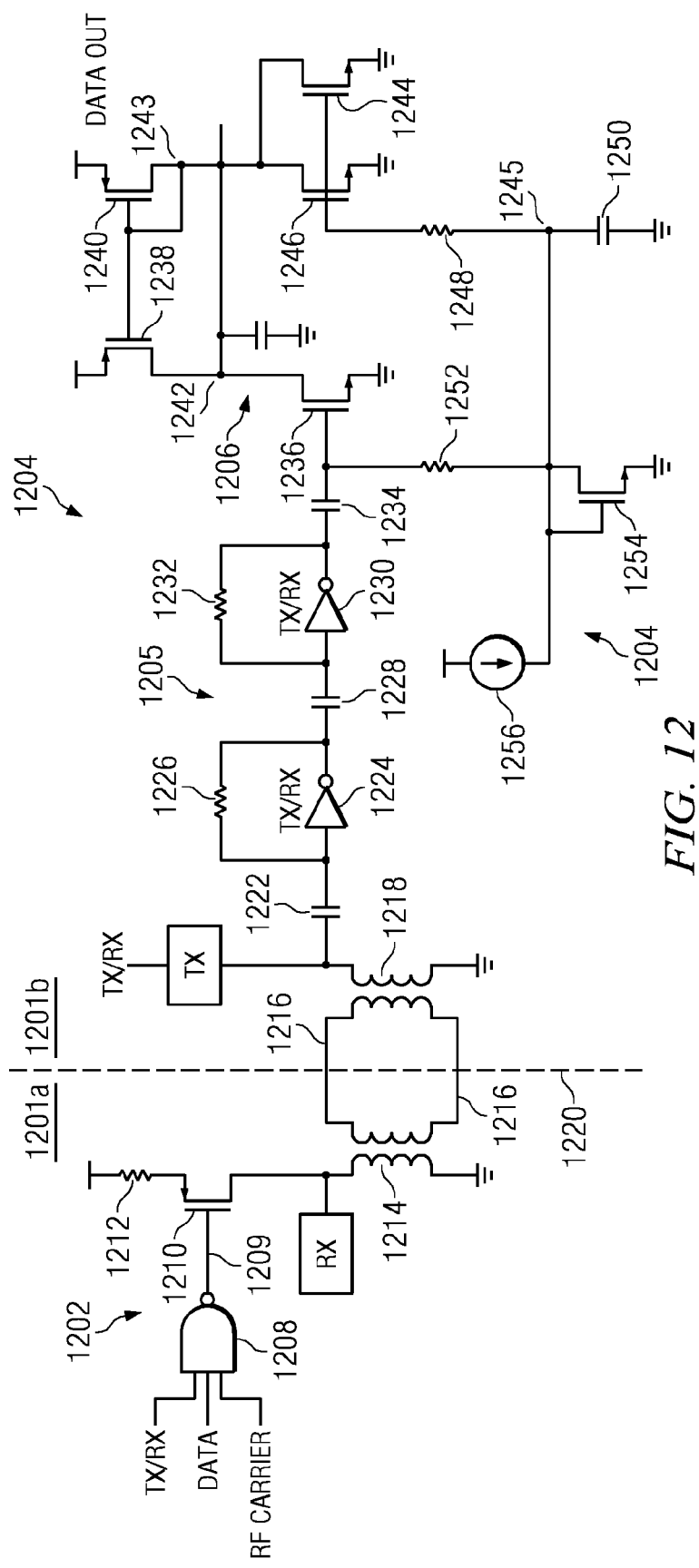
FIG. 12 is a schematic diagram illustrating the circuitry for providing an RF isolation link.

Referring now to FIG. 12, there is illustrated the inductor coupled embodiment of the RF isolation link of the present disclosure wherein amplitude modulation is used to transmit data over the link. The RF isolation link consists of transmitter circuitry 1202 and receiver circuitry 1204. The transmitter circuitry 1202 consists of a NAND gate 1208 having a first input connected to receive the data to be transmitted over the RF isolation link and a second input connected to receive the RF carrier signal. The RF carrier in this embodiment comprises a 2 GHz signal. The data input to the first input of the NAND gate 1208 consists of either a logical "1" or "0" which will selectively gate the RF carrier signal to the output of NAND gate 1208 in the presence of a logical "1." This causes the output 1209 of the NAND gate 1208 to either provide the RF carrier signal when the data bit is "1" or not provide the RF signal when the data bit is "0." The output of the NAND gate 1209 is connected to the gate of a p-channel transistor 1210. The drain-source path of the p-channel resistor 1210 is connected between $V_{DD}$ and ground through a resistor 1212 and a first transformer 1214. The transformer 1214 electromagnetically couples the RF carrier signal to transformer 1218 via lines 1216. This links the data represented by the RF carrier signal between the first MCU and the second MCU while providing voltage isolation between the MCUs via the first and second transformers 1214, 1218. Each of the transformers 1214 and 1218 are associated with a particular MCU on opposite sides of interface 1220. Thus, wherein previous systems required a separate chip to provide an isolation link between two separate chips, the present disclosed device integrates the RF isolation link onto the MCUs. There is provided a TX/RX enable with respect to the gate 1208 to allow for directional programming thereof.

The receiver circuitry 1204 receives the signal which has been electromagnetically coupled via transformer 1214 onto the transmission lines 1216 to transformer 1218. The receiver circuit 1204 consists of an amplifier 1205 and a detector 1206. The amplifier 1205 provides two stages of amplification consisting of a first amplification stage including a capacitor 1222 in series with an amplifier 1224 and a feedback resistor 1226. The second amplifier stage is similar to the first amplifier stage and includes a capacitor 1228 in series with an amplifier 1230 and a feedback resistor 1232. These two stages amplify the received signal from the transformer 1218.

The detector 1206 detects the presence or absence of the RF carrier signal within the amplified received signal to determine the data being transmitted from the first MCU. The amplified signal from the amplifier 1205 is first filtered by a capacitor 1234. N-channel transistor 1236 has the gate thereof connected to capacitor 1234 and has the source-drain path thereof connected to one side of a current mirror comprised of p-channel transistors 1238 and 1240. The source-drain path of transistor 1238 is connected between VDD and node 1242, the gate thereof connected to the gate of transistor 1240. The source-drain path of transistor 1240 is connected between VDD and a node 1243, the gate thereof connected to node 1243 to provide a diode connected configuration. The output of the detector 1206 is provided from node 1242 at which the source-drain path of the n-channel transistor 1236 is connected to the p-channel transistor 1238 of the current mirror. A bias network is provided by n-channel transistors 1244 and 1246 which have the source-drain paths thereof connected between node 1243 and ground and the gates thereof connected to a node 1245 through a resistor 1248, with a capacitor 1250 connected between node 1245 and ground. Biasing is also provided by resistor 1252 connected between node 1245 and the gate of transistor 1236, a diode connected p-channel transistor 1254 connected between node 1245 and ground and a current source 1256 for driving node 1245. When no RF signal is detected by the receiver, the Data Out from node 1242 of the detector circuit 1206 will be equal to VDD since the PMOS current is greater than 1.33 times the NMOS current and a logical "0" is detected. In the presence of the RF signal, the Data Out from node 1242 will vary in response to the variation of the detected RF carrier signal and a logical "1" is detected. The detector 1206 outputs a low voltage when RF is present and a high voltage when RF is absent relying on the nonlinear (square root) behavior of the MOS device directed by the alternating current.

Figure 13:
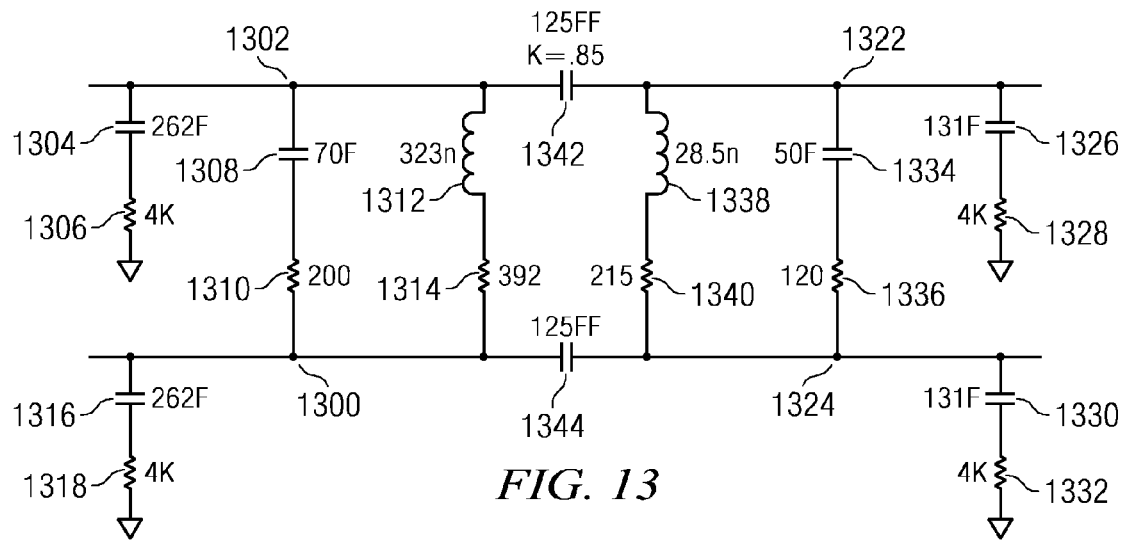
FIG. 13 illustrates a model of the RF isolation link.

Referring now to FIG. 13, there is illustrated a model for the transformers (1214, 1218) illustrated in FIG. 12. The input of the transformer consists of nodes 1302 and 1300. Node 1302 is connected to ground through capacitor 1304 and resistor 1306. Node 1300 is connected to ground through capacitor 1316 and resistor 1318. Node 1302 interconnects with node 1300 via a parallel connection of capacitor 1308 in series with resistor 1310 and inductor 1312 in series with resistor 1314. The output of the transformer consists of nodes 1322 and 1324. Node 1322 is connected to ground through capacitor 1326 and resistor 1328. Node 1324 is connected to ground through capacitor 1330 and resistor 1332. Node 1322 interconnects with node 1324 via a parallel connection of capacitor 1334 in series with resistor 1336 and inductor 1338 in series with resistor 1340. Nodes 1302 and 1322 are interconnected via a capacitor 1342 with a value of approximately 125 fF. Nodes 1300 and 1324 are interconnected via a capacitor 1344 with a value of approximately 125 fF.

Figure 14A:
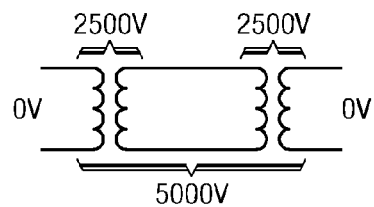
FIGS. 14a and 14b illustrate the voltages across each inductor and capacitor, respectively, within an RF isolation link and across the entire RF isolation link.
Figure 14B:
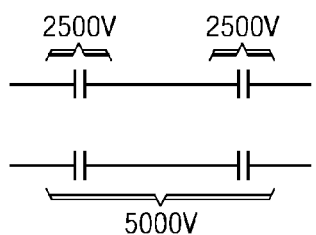

Using the RF isolation links described above, voltage isolation of up to 5,000 volts may be achieved, 2,500 volts for each side. Thus, as illustrated in FIG. 14a for the inductor based isolator and FIG. 14b for the capacitive isolator, the RF isolation circuit may provide 5,000 volts of isolation between a first MCU and a second MCU. While the voltage between the input terminals of the first MCU will be zero volts and the voltage between the input terminals of the second MCU will also be zero volts, the total voltage difference between the two MCUs may be 5,000 volts with a 2,500 volt difference across each of the transformers 1214, 1218 associated with the interfaces to the RF isolation circuit on each MCU.

Figure 15A:
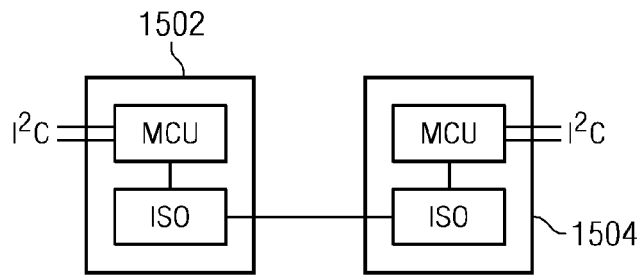
FIGS. 15a-15e illustrate various applications in which the MCU with integrated isolation circuitry may be utilized.
Figure 15B:
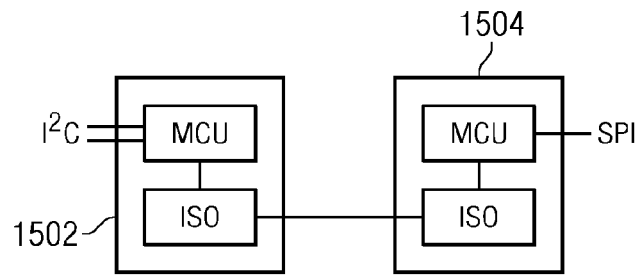

Referring now also to FIGS. 15a and 15b, using the control flexibility provided by a microcontroller unit having integrated voltage isolation circuitry, a number of applications may be utilized. Utilizing a pair of microcontroller units configured as described herein above, various different types of information may be transmitted across the voltage isolation link. In the embodiment illustrated in FIG. 15a, an I²C protocol may be used to communicate information from one microcontroller unit 1502 to a second microcontroller unit 1504 wherein the I²C protocol is maintained on each side of the voltage isolation link. In another embodiment illustrated in FIG. 15b, the pair of MCUs may be used as a protocol converter. Input to the first MCU 1502 is data according to the I²C protocol (by way of illustration, understanding that any data protocol could be utilized). That information is transmitted across the voltage isolation link between the two MCUs and at the second MCU 1504, the data is output in the SPI interface format (different protocol than that on the other side of the isolation boundary). The conversion from one protocol to the other may be according to any particular protocol and the use of the I²C and SPI protocols is merely by way of example.

Figure 15C:
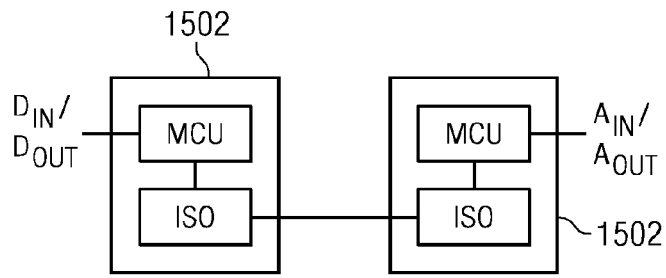
Figure 15D:
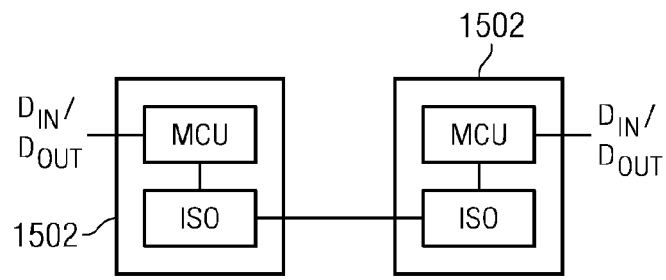
Figure 15E:
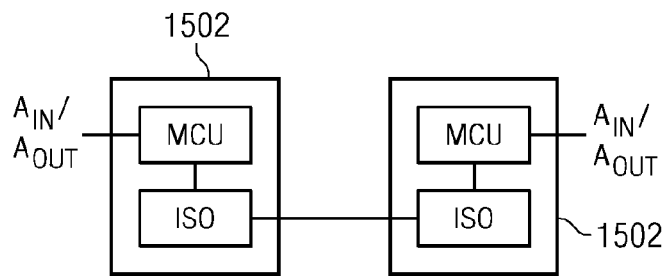

FIG. 15c illustrates the manner in which the microcontroller units 1502 may be used to provide a conversion from a digital signal to an analog signal or vice versa across the voltage isolation barrier. In this case, a digital signal is input or output from an MCU on one side of the voltage isolation barrier and the analog is input or output from the MCU at the microcontroller unit 1502 on the other side of the voltage isolation barrier. In addition to conversions from digital-to-analog or analog-to-digital across the voltage isolation barrier, digital-to-digital or analog-to-analog conversions may be performed as shown in FIGS. 15d and 15e. FIG. 15d illustrates how a digital signal is transmitted across the voltage isolation barrier from a first microcontroller unit 1502 to the second microcontroller unit 1502. Similarly, as shown in FIG. 15e, an analog signal may be provided on one side of a voltage isolation barrier at a microcontroller unit 1502 and output on the opposite side of the barrier at a second microcontroller unit 1502 as the same analog signal. In addition to converting the signals from digital-to-digital, analog-to-analog, analog-to-digital or digital-to-analog, the analog or digital signals may be provided on opposite sides of the voltage isolation barriers according to different protocols as described previously with respect to FIG. 15b. Thus, the combination of the microcontroller unit and voltage isolation circuitries implemented within a single integrated microcontroller unit provides circuit designers with a great deal of flexibility for transmitting signals in varying formats across high voltage isolation links.

Figure 16:
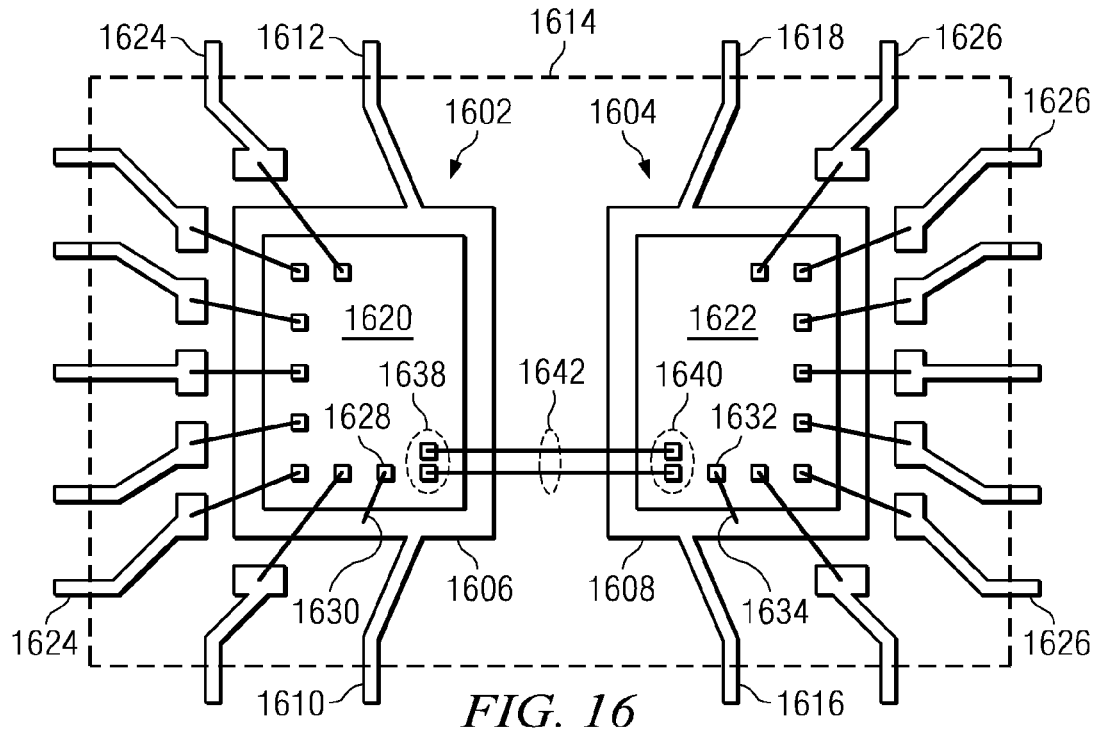
FIG. 16 illustrates a diagrammatic view of the lead frame with the two die attached thereto.

Referring now to FIG. 16, there is illustrated a diagrammatic view of the embodiment wherein two separate die are disposed in a common package with a galvanically isolated boundary disposed therebetween with the capacitive (or inductive) isolator structure providing the data transfer connection therebetween. There are provided two lead frames 1602 and 1604. Each of the lead frames 1602 and 1604 includes a die mounting pad 1606 and 1608, respectively. Die mounting pad 1606 has two ground leads 1610 and 1612 associated therewith that extend from a package boundary 1614. Similarly, the die mounting pad of 1608 has two ground leads 1616 and 1618, respectively associated therewith.

Mounted on the surface of the two die mounting pads 1606 and 1608 are die 1620 and 1622, respectively. Each of these die 1620 and 1622 have associated therewith the MCU/isolator combination described hereinabove. The two separate die mounting pads 1606 and 1608 provide a completely separate DC connection such that the two die 1620 and 1622 are galvanically isolated.

Associated with the die mounting body 1606 are a plurality of leads 1624 and, similarly, the die mounting body 1608 has associated therewith a plurality of leads 1626. The die mounting pads 1608 and 1606, respectively, are each provided for mounting the chip thereon. Typically, the bottom surface of the chip will be associated with a ground connection. There are provided bonding pads on the upper surface of the die 1620 and 1622 that are designed to be bonded out to respective ones of the leads 1624 or 1626, respectively, or they can be bonded to the die mounting body 1606 or 1608, depending upon the functionality required. Typically, there will be a chip ground on the surface of the chip that is to be bonded to the respective ground on either side of the galvanic boundary and this will typically result in a bond wire from a pad 1628 for the die 1620 to the body 1606, on one hand, through a bond wire 1630. Similarly, with respect to the die 1622, there will be provided a bond pad 1632 having a bond wire 1634 connected from the bond pad 1632 to the body 1608. This is to provide chip ground. However, although not shown, there is also the possibility of bonding out the various enable pins to either ground or $V_{DD}$ for the purpose of permanently enabling or disabling functionality, as will be described hereinbelow.

In order to provide the isolator connection across an isolation boundary, there are provided two bonding pads 1638, which correspond to the upper plates of the capacitors on the die 1620 associated with the isolator function. Of course, this also could represent the top coil in an inductor connection, as described hereinabove. On the die 1622, there are provided two corresponding pads 1640. There are provided a pair of bond wires 1642 connecting the pads 1638 to the pads 1640. This provides the isolation function.

Although the MCU/isolator functionality is described as being contained on a common die 1620 or 1622, it should be understood that multiple chips could be mounted onto the respective die mounting body 1606 or 1608. This is not uncommon in a packaged integrated circuit. It could be that the processor functionality is contained on a separate MCU chip and a separate isolator chip would be provided. For example, it might be that a separate integrated circuit could have been utilized for just the capacitors themselves, to take advantage of a separate high voltage process for the capacitors to provide a significantly higher breakdown voltage.

In order to transmit data across the isolation boundary, the data must be converted to a serial data format. As described hereinabove, one serial data format that has been proposed is that utilizing a Manchester coded data string. This is asynchronous transmission, which requires clock recovery at the opposite end, i.e., the receiving end. However, a "two-wire" system could be utilized wherein a first path is provided for a clock signal and a second path is provided for the data. This, of course, would require two isolation circuits and four capacitors (or four inductors). However, the speed of transmission is of concern, since the fastest data that would be transferred across the isolation boundary would be parallel data. Parallel data could be transmitted in parallel, which would require, for example, eight data paths for transmission/reception for an 8-bit wide bus. This, of course, requires a significant amount of silicon real estate and bond wires. The disclosed embodiment hereinabove utilizes a parallel-to-serial conversion operation wherein parallel data is converted to serial data and then transmitted across the boundary. Since the parallel data is generated and transmitted at substantially the clock rate of the processor, the conversion to serial data and transmission thereof across the isolation boundary must be faster, thus requiring the higher frequency serial clock. Of course, if only serial data formats were to be transmitted, i.e., SPI formatted data or I²C formatted data, then the higher frequency clock would not be necessary. Parallel data could not then be accommodated over a single data path.

In order to transmit parallel data, both processors on either side of the isolation boundary would have to have common programs wherein the data were transmitted at one particular rate, i.e., the parallel data were first loaded into the SFR 354 and then processed until it was received at the SFR 354 on the opposite side generating an interrupt. The data would then be processed on the receiving side in such a manner that the SFR 354 were cleared allowing the next byte of data to be received therein. Of course, this is an operation where the timing on both sides of the isolation boundary would have to be coordinated such that the overall operation functioned with an elastic buffer configuration.

If serial data is to be transmitted, data would be received in a serial format, for example, the UART block 326. Interfaced to the exterior world on one side of the isolation boundary would be the UART functionality. This UART 326 would interface with select ones of the port pins 322. The data would be received as serial data in accordance with the UART protocol, converted to parallel data on the SFR bus 320 and then processed by loading that information into the ISO SFR 354. On the opposite side the isolation boundary, on the receive side thereof, the data that is being received across the isolation boundary could be converted back to a UART format and transmitted.

In an alternate embodiment, as described hereinabove, the data could be received by the ADC 346 at the sampling rate thereof, converted to a parallel data and loaded into the ISO SFR 354 at the sampling rate. All that is required is that the isolation circuitry, i.e., the encoder/decoder 356 and the serializer/deserializer block 358 operate at a sufficiently high enough frequency to convert the data from parallel data to serial data, transmitted across the isolation boundary and then be ready for the next byte of data that is sampled by the ADC 346.

As also noted hereinabove, data could be received on one side in a UART format and transmitted out in an SMBus format, which is basically an I²C protocol, with the block 332. All that is required is that the particular MCU to be programmed on either side of the isolation boundary and that the programs on both sides of the isolation boundary be coordinated. To the user, however, these are transparent, i.e., if data is transmitted into the chip on one side, it shows up at the other side as if transmitted directly therethrough. For example, if parallel data were input to one side of the isolation boundary, one of the port pins would be basically a toggle pin that would clock the data through. This would cause the data to "appear" at the other side of the isolation boundary, merely because the MCU on the other side of the boundary is programmed accordingly. This would be the same with respect to serial data or analog data. With respect to analog data, the analog data would be input to the ADC 346 on one side, converted to parallel data and then parallel data transmitted across the boundary and output as parallel data (or serial data) on the opposite side of the boundary with the user having no knowledge that there is any isolation boundary even involved.

Figure 17:
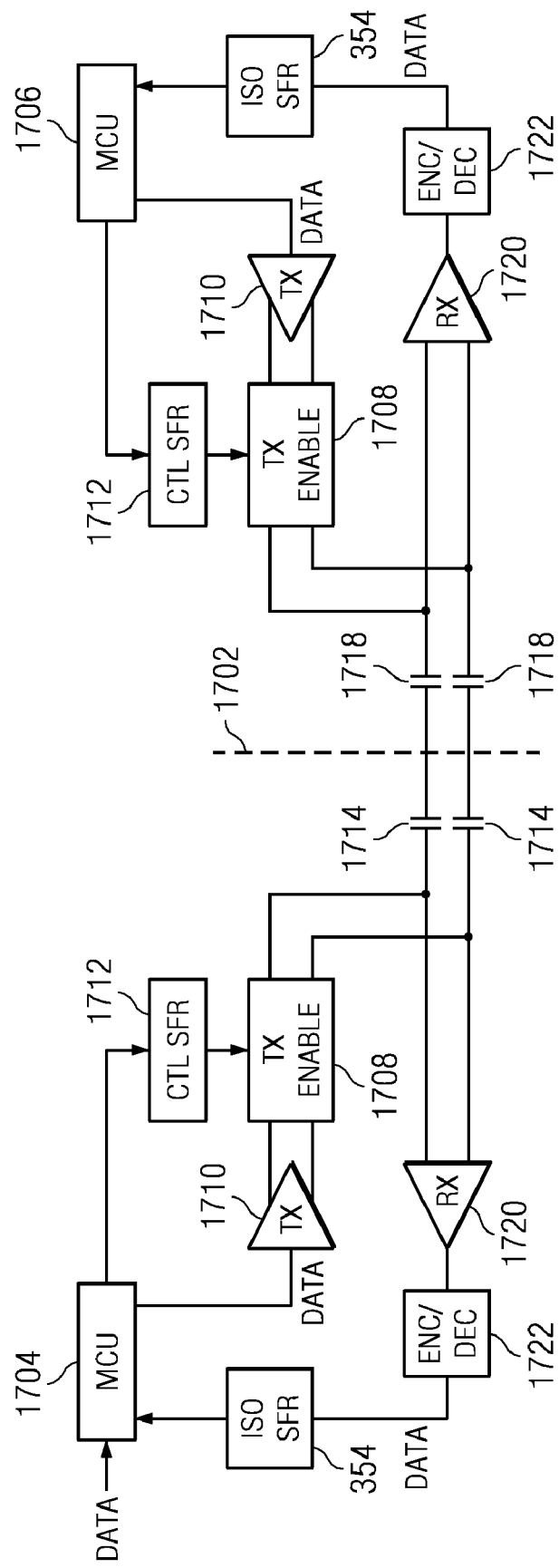
FIG. 17 illustrates a diagrammatic view of the transceiver operation between the two die.

Referring now to FIG. 17, there is illustrated a diagrammatic view illustrating two sides of an isolation boundary 1702, with an MCU 1704 disposed on one side thereof and MCU 1706 disposed on the other side thereof. In order for there to be bidirectional transfer across the boundary, to the extent that that is necessary, it is necessary to control the direction of transfer with the MCU 1704. However, it is possible that the product could be programmed restricted to a single direction, i.e., on one side, the transmitter is enabled such that it is always in the transmit mode and on the other side, the transmitter is disabled. This would be a unidirectional operation.

When the chip is manufactured and packaged for this operation, all that would be required is to connect the enable pin to a high voltage or low voltage, a bonding option. However, if bidirectional transfer is required, then there must be a provision to enable or disable the transmit operation. This is the embodiment disclosed in FIG. 17.

In FIG. 17, the transmit enable portion of the transmitter is illustrated by a function block 1708 on both sides of the isolation boundary 1702. It should be understood that both sides of the isolation boundary 1702 will have similarly labeled parts. There is provided a transmitter 1710 on each side that provides an input to the transmit enable block 1708. Although not shown, the transmitter 1710 has an encoder/serializer associated therewith. Each side of the isolation boundary 1702 has a control SFR 1712 that will contain bits that will configure and control the operation. Generally, a bit can be set by the respective MCU 1704 and 1706 to configure the operation as transmit or receive. This is also where the output of the transmit enable drives one side of two capacitors 1714 on one side of the isolation boundary 1702 associated with the MCU 1704 and the transmit enable block 1708 drives one side of two capacitors 1718 on the side of the isolation boundary 1702 associated with the MCU 1706. The top plates of the capacitors 1714 and 1718 are connected together, as described hereinabove. Again, as noted hereinabove, these could be inductive and not necessarily capacitive.

A receiver 1720 is provided on both sides of the isolation boundary and connected to the bottom plates of capacitors 1714 and 1718, respectively. Each of the receivers 1720 will have the output thereof passed through the encoder/decoder/serializer/deserializer block 1722 to provide data to the ISO SFR 354. This is then input to the MCU 1704. Each time data is transmitted across the isolation boundary 1702, regardless of which one is transmitting it, the respective receiver will generate the data and store it in the SFR 354 and generate an interrupt after storage thereof. Thus, the MCU 1704 or the MCU 1706 will be aware of when data is transmitted. Thus, whenever it is desirable to transmit data, it will be necessary first to determine if data is being received. If data is being received, the interrupt will cause the bus to be indicated as being seized by the opposite side, i.e., the other side of the isolation boundary 1702 has seized the bus or data communication path. Thus, the side having received data will determine if it has to wait to transmit data. Additionally, although not illustrated, it is possible to provide a level detect circuit on the input to the receiver 1720. Since data will be transmitted at a high frequency, i.e., the frequency of the carrier, it is possible to detect data transmitted at that frequency. It will typically take approximately three cycles of a high frequency clock to provide a level detect output. It is possible for the MCU 1704 or 1706 to "poll" this level detect circuit to determine if there is indeed any activity on the line. The reason to do this is that an entire byte of data must be transmitted for the SFR 354 to generate the interrupt. Of course, data contention with a single dedicated path is not that large of a problem and, therefore, a level detect may not be necessary. In any event, when data is to be transmitted MCU 1704 or 1706 examines its interrupt status to determine if data has been received within a certain amount of time. If not, then that means that the data communication path is available and the transmitter can be enabled and then data transferred.

Figure 18:
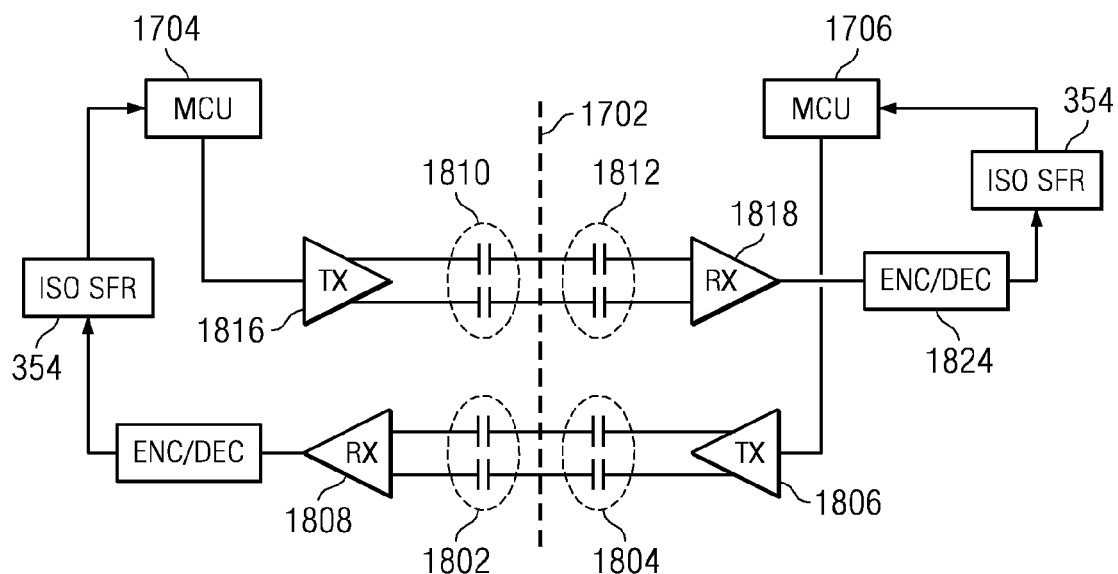
FIG. 18 illustrates an alternate embodiment utilizing two separate transmit/receive paths.

Referring now to FIG. 18, there is illustrated an alternate embodiment wherein a separate transmit path and a separate receive path can be provided. This would require two isolation circuits that were hard coded to provide one path for transmit and one path for receive. This would require two sets of capacitors on either set of the side of the isolation boundary. This will require a first set of capacitors 1802 and 1804 associated with a first transmitter 1806 on the MCU 1706 side of the isolation boundary 1702 and a receiver 1808 on the MCU 1704 side. Although not illustrated, there would be a transmitter on the side of the MCU 1704 and a receiver on the side of the MCU 1706 that would be disabled and not used. A second set of capacitors 1810 on the MCU 1704 side of the isolation boundary 1702 and a pair of capacitors 1812 on the MCU 1706 of the isolation boundary would provide for transmission from the MCU 1704 to the MCU 1706. This would have a transmitter 1816 on the MCU 1704 side of the isolation boundary and a receiver 1818 on the MCU 1706 side of the isolation boundary 1702. Although not shown, the transmitter 1816 and the transmitter 1806 have encoder/serializer blocks associated therewith. Thus, for transmission of data, the MCU 1704 would transmit data through the transmitter 1816, capacitors 1810 and 1812 and receiver 1818 for encoding/decoding and serializing with a block 1824 for loading into the ISO SFR 354 on the MCU 1706 side of the isolation boundary 1702. The MCU 1704 would receive data through the receiver 1808 and an encoder/decoder/serializer on the MCU 1704 side of the isolation boundary 1702. This would be stored in the ISO SFR 354 associated therewith.

Figure 19:
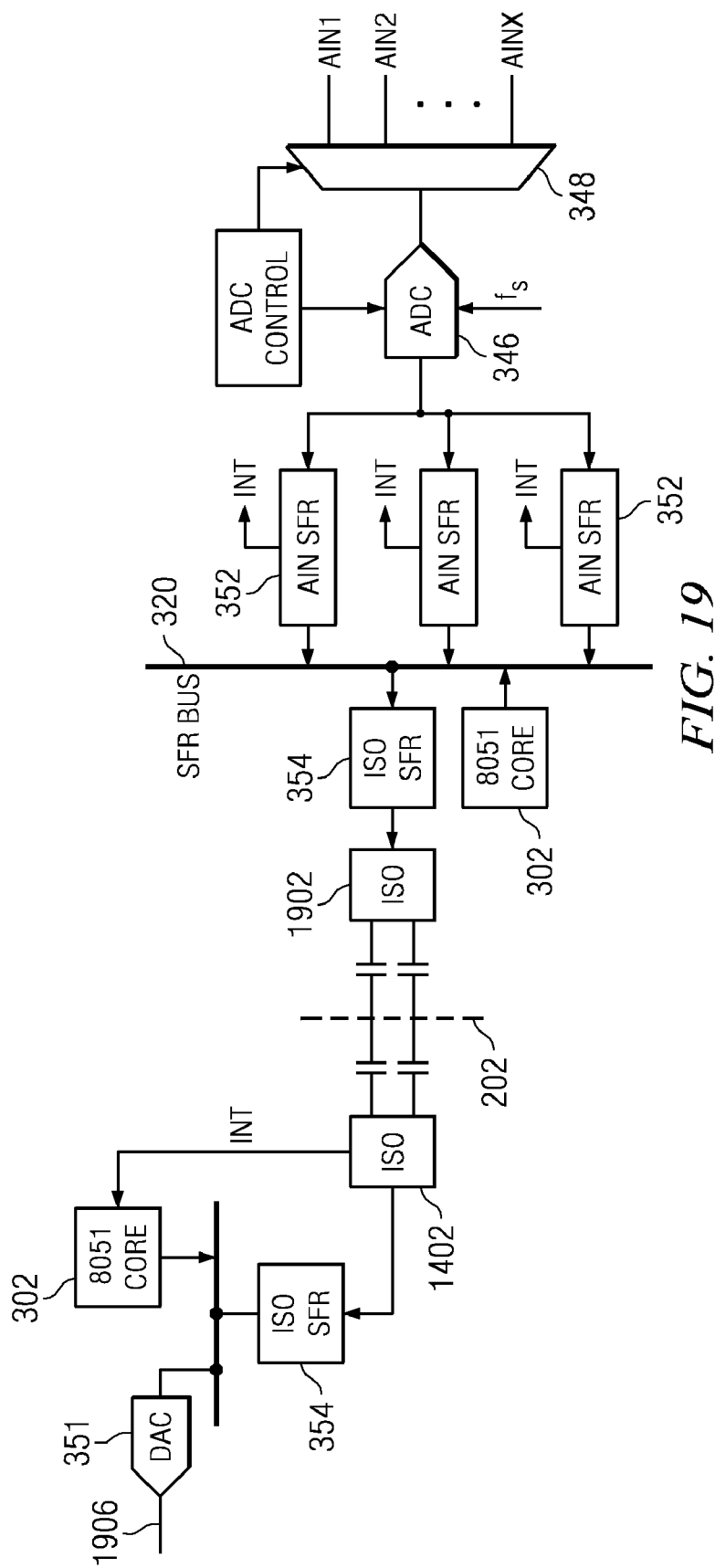
FIG. 19 and FIG. 19a illustrate an alternate embodiment of the present invention showing one application thereof.
Figure 19A:

Referring now to FIG. 19, there is illustrated an application wherein analog data is received on one side of the isolation barrier 202 and transmitted to the other side thereof. In this embodiment, the analog multiplexer 348 is utilized to scan the analog inputs in other auto scan mode or under the control of the 8051 core 302. The auto scan feature is described in U.S. Pat. No. 7,142,140, issued Nov. 28, 2006, which is incorporated herein by reference in its entirety. Also, the MCU 104 is described herein. In the auto scan mode, the analog inputs are scanned and input to the ADC 346. The ADC 346 is sampled at a 16 MHz rate. The data is then sequentially input to one of the SFRs 352. As described in U.S. Pat. No. 7,142,140, the SFRs 352 can incorporate an interrupt feature wherein there is a limit function to provide an over/under window for comparison therewith. If the analog voltage goes outside of that window (or, conversely, within the window), then an interrupt is generated. The 8051 core 302 associated with that side of the isolation barrier 202 will service that interrupt. In servicing the interrupt, the contents of the SFR 352 generating the interrupt will be transferred to the isolator SFR 354 and, at that time, the isolator circuitry, comprised of the encoder/decoder 356, serial/deserializer 358 and capacitive isolator 360, will be utilized to transfer the data across the isolation barrier 202. This isolation function is illustrated by a block 1902 for simplicity. On the other side of the isolation barrier 202, the corresponding isolation block 1902 will decode the information and store it in the isolator SFR 354 associated with that side. As noted hereinabove, when data is stored in the isolator SFR 354, an interrupt is generated by the decoding circuitry indicating that a byte has been decoded and has been transferred to the SFR 354. The 8051 core 302 on that side of the isolation barrier will service the interrupt and then extract the data from the SFR 354 for processing thereof. However, it is important that the 8051 core 302 on the receiving side of the isolation barrier 202 be able to interpret which interrupt was generated, i.e., which input on the multiplexer 348 and which input 10 was being sensed. To facilitate this, keeping in mind that this is an asynchronous operation on both sides of the isolation barrier 202, a command structure could be utilized. This is illustrated in FIG. 19a. In this type of structure, what occurs is that a sequence of known bytes of data are transferred across the isolation barrier to the 8051 core 302. Typically, although not necessarily limiting, this can be a command structure. This would be comprised of a header or start field, a command field and a stop or end field. The header field could be as simple as one or two bytes of data with alternating "1's" "0's" or some other known sequence. As long as the sequence is long enough, the 8051 core 302 will recognize this as a synchronizing section indicating that, after three or four bytes (it could even be one byte), the next byte or sequence of bytes, a predetermined number, would be received indicating the command. The command could be that the next data to be received will be analog data that is being sensed from a defined input of the multiplexer 348. It is necessary to keep in mind that both sides of the isolation barrier are programmed for a particular application, although a more sophisticated command language could be utilized to facilitate multiple applications. Once the command has been interpreted, this will be followed by an end field or stop field. This again, is a sequence of bytes of known values. The next byte of data or bytes of data would be the contents of the SFR 352 that generated the interrupt.

Alternatively, it could be that the 8051 core 302, in accordance with instructions associated therewith and executed thereon would go through and scan the various inputs by controlling the multiplexer 348 to select any one input. For example, one of the inputs could be the temperature, and the program could require temperature to be sensed at periodic intervals. When this temperature is sensed, it is then transferred to the 8051 core 302 on the opposite side of the isolation barrier with an indication thereof. This just requires the command structure in FIG. 19a to be followed.

In an alternative method, it could be that the system is configured to transmit a single one of the sensed inputs in the analog domain as a received analog value and transmitted across the isolation barrier 202 to the SFR 354 for output as an analog value in real time. When received, it will immediately be transmitted out of the DAC 351 to an analog output 1906. Thus, what would occur would be a straight pass through of an analog value from one side to the other. It should be remembered, however, that there will be some latency associated with the transfer, but latency will be relatively small.

In another embodiment, the MCUs on either side of the galvanic isolation barrier can be programmed such a single bit received on one GPIO pin on one side can be transmitted across the isolation or galvanic barrier as a part of a parallel word—the only part. Each bit is stored in the parallel word stored in the SFR 354 as the LSB. When decoded, the MCU on the receiving side extracts the LSB and outputs it to a GPIO pin on the receiving side.

It will be appreciated by those skilled in the art and having the benefit of this disclosure that this MCU with integrated voltage isolator provides flexible signal processing capabilities with voltage isolation. It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. An integrated circuit, comprising:
    a first microcontroller unit disposed on a first die for executing instructions in accordance with a first clock frequency generated on the first die, the first microcontroller unit including a first processing core for generating parallel data in accordance with the first clock frequency;
    first transceiver circuitry located on the first die for converting between the parallel data and a serial data stream in accordance with a second clock frequency generated on the first die that is faster than the first clock frequency;
    a second microcontroller unit disposed on a second die for executing instructions in accordance with a third clock frequency generated on the second die, the second microcontroller unit including a second processing core for processing parallel data in accordance with the third clock frequency;
    second transceiver circuitry located on the second die for converting between a serial data stream and parallel data in accordance with a fourth clock frequency generated on the second die that is faster than the third clock frequency;
    the first die galvanically isolated from the first die; and
    isolation circuitry for transmitting serial data from the first transceiver to the second transceiver across a galvanic isolation barrier such that parallel data processed by the first microcontroller unit can be received by the second microcontroller unit with the transmission across the galvanic isolation link being a serial data stream, and the first and second clock frequencies generated on the first die not synchronized with the third and fourth clock frequencies generated on the second die.

2. The integrated circuit of claim 1, further including an analog to digital converter for converting an analog signal into parallel data on the first die for processing by the first microcontroller unit.

3. The integrated circuit of claim 1, further including a digital to analog converter for converting the parallel data processed by the second microcontroller unit to an analog signal.

4. The integrated circuit of claim 1, wherein each of the first and second transceiver circuitry further comprises:
    an encoder/decoder circuit for converting between a non-encoded parallel data and encoded parallel data; and
    a serializer/deserializer circuit for converting between the encoded serial data and the encoded parallel data stream.

5. The integrated circuit of claim 4, wherein the encoder/decoder circuit performs Manchester encoding and decoding.

6. The integrated circuit of claim 4, further including at least one special function register associated with the second die for storing the parallel data provided by the second transceiver circuitry, wherein the at least one special function register generates an interrupt to the processing core associated with the second microcontroller unit indicating the presence of the parallel data received over the isolation link.

7. The integrated circuit of claim 4, further including a respective multiplier clock for multiplying a respective system clock on each of the respective first and second dies, each respective system clock operating in accordance with the respective first and third clock frequencies and controlling the respective encoder/decoders, the respective multiplier clocks for multiplying the respective system clocks by a respective predetermined multiplier to create the respective second and fourth clock frequencies for operating the respective serializer/deserializer circuits and the respective isolation circuitry in accordance with the second clock frequency.

8. The integrated circuit of claim 1, wherein the first microcontroller unit converts between an input analog signal and parallel data to be transmitted and the second microcontroller unit converts between received parallel data and an output analog signal.

9. The integrated circuit of claim 1, wherein the first microcontroller unit converts between data in an input data protocol and parallel data to be transmitted and the second microcontroller unit converts between received parallel data and output data in an output data protocol.

10. An integrated circuit, comprising:
    first and second semiconductor die disposed in a package and galvanically isolated;
    a galvanic isolation data link disposed between the first and second die;
    a first microcontroller unit disposed on the first die for executing instructions in accordance with a first clock frequency generated on the first die, the first microcontroller unit including a first processing core for providing parallel data to be transmitted across the isolation link to the second die, and the parallel data generated and processed in accordance with the first clock frequency;
    a second microcontroller unit disposed on the second die for executing instructions in accordance with substantially the first clock frequency, the second microcontroller unit including a second processing core for processing parallel data received across the isolation link from the first die, and the received parallel data processed in accordance with substantially the first clock frequency;
    the galvanic isolation link including capacitive isolation circuitry connected with the first microcontroller unit and the second microcontroller unit for providing a high voltage isolation link between the first and the second microcontroller units, the capacitive isolation circuitry distributing a first portion of a high voltage isolation signal across a first group of capacitors associated with the first microcontroller unit and distributing a second portion of the high voltage isolation signal across a second group of capacitors associated with the second microcontroller unit, the capacitive isolation circuitry further transmitting data from the parallel data stream between the first microcontroller unit and the second microcontroller unit in a serial data stream in accordance with respective isolation clock frequencies on each side of the isolation link; and wherein the clock frequencies on either side of the isolation link operate asynchronous.

11. The integrated circuit of claim 10, further including:
first processing circuitry located on the first die for converting between the parallel data to be transmitted in the serial data stream; and
second processing circuitry located on the second die for converting between the serial data stream and the received parallel data.

12. The integrated circuit of claim 11, further including an analog to digital converter on the first die for converting an input analog signal into the parallel data to be transmitted.

13. The integrated circuit of claim 11, further including a digital to analog converter on the second die for converting the received parallel data to an output analog signal.

14. The integrated circuit of claim 11, wherein the first and second processing circuitry further comprises:
an encoder/decoder circuit for converting between non-encoded parallel data and encoded parallel data; and
a serializer/deserializer circuit for converting between the encoded serial data and the encoded parallel data.

15. The integrated circuit of claim 14, wherein the encoder/decoder circuit performs Manchester encoding and decoding.

16. The integrated circuit of claim 14, further including at least one special function register on the second die for storing the received parallel data, wherein the at least one special function register generates an interrupt to the processing core associated with the second microcontroller unit indicating the presence of the received parallel data.

17. The integrated circuit of claim 14, further including a multiplier clock on the first die for multiplying a system clock on the first die, operating in accordance with the first clock frequency and controlling the encoder/decoder, by a predetermined multiplier to create the second clock frequency for operating the serializer/deserializer circuit and the capacitive isolation circuitry in accordance with the second clock frequency.

18. The integrated circuit of claim 14, further including a multiplier clock for multiplying a system clock, operating in accordance with the first clock frequency and controlling the encoder/decoder, by a predetermined multiplier to create the second clock frequency for operating the serializer/deserializer circuit and the capacitive isolation circuitry in accordance with the second clock frequency.

19. The integrated circuit of claim 10, wherein the first microcontroller unit converts an input analog signal to the parallel data to be transmitted and the second microcontroller unit converts the parallel stream of data to an output analog signal.

20. The integrated circuit of claim 10, wherein the first microcontroller unit converts data in a first protocol to the parallel data to be transmitted and the second microcontroller unit converts the received parallel data to data in a second protocol.

21. The integrated circuit of claim 20, wherein the first and second transceiver circuitry further comprises:
an encoder/decoder circuit for converting between a non-encoded parallel data stream and an encoded parallel data stream; and
a serializer/deserializer circuit for converting between the encoded serial data and the encoded parallel data stream.

22. An integrated circuit, comprising:
a first microcontroller unit for executing instructions in accordance with a first clock frequency located on a first die including a first processing core for providing a parallel stream of data in accordance with the first clock frequency;
first transceiver circuitry located on the first die for converting between the parallel data stream and the serial data stream in accordance with a second clock frequency that is faster than the first clock frequency;
a second microcontroller unit for executing instructions in accordance with the first clock frequency located on a second die including a second processing core for receiving the parallel stream of data in accordance with the first clock frequency;
second transceiver circuitry located on the second die for converting between the serial data stream and the parallel data stream in accordance with the second clock frequency;
capacitive isolation circuitry for bidirectionally transmitting data from the parallel data stream between the first microcontroller unit and the second microcontroller unit in a serial data stream in accordance with the second clock frequency and providing galvonic isolation between the first microcontroller unit and the second microcontroller unit.

23. The integrated circuit of claim 22, further including at least one special function register for storing the parallel data sample, wherein the at least one special function register generates an interrupt to the processing core indicating the presence of the parallel data sample.

* * * * *